(12) United States Patent
Hao et al.

(10) Patent No.: US 8,134,212 B2
(45) Date of Patent: Mar. 13, 2012

(54) IMPLANTED WELL BREAKDOWN IN HIGH VOLTAGE DEVICES

(75) Inventors: Pinghai Hao, Plano, TX (US); Seetharaman Sridhar, Richardson, TX (US); James Robert Todd, Plano, TX (US)

(73) Assignee: Texas Instruments Incorporated, Dallas, TX (US)

( * ) Notice: Subject to any disclaimer, the term of this patent is extended or adjusted under 35 U.S.C. 154(b) by 418 days.

(21) Appl. No.: 12/538,594

(22) Filed: Aug. 10, 2009

(65) Prior Publication Data
US 2010/0032769 A1 Feb. 11, 2010

Related U.S. Application Data

(60) Provisional application No. 61/087,260, filed on Aug. 8, 2008.

(51) Int. Cl.
| H01L 29/76 | (2006.01) |
| H01L 29/94 | (2006.01) |
| H01L 31/062 | (2006.01) |
| H01L 31/113 | (2006.01) |
| H01L 31/119 | (2006.01) |
| H01L 29/00 | (2006.01) |
| H01L 21/331 | (2006.01) |
| H01L 21/76 | (2006.01) |

(52) U.S. Cl. .......... 257/378; 257/544; 257/E21.37; 257/E21.544; 257/E27.015; 257/E29.019; 438/356; 438/414

(58) Field of Classification Search .......... 257/378, 257/544, E21.37, E21.544, E27.015, E29.019; 438/356, 414
See application file for complete search history.

(56) References Cited

U.S. PATENT DOCUMENTS

| 5,436,179 | A * | 7/1995 | Erdeljac et al. ........... 438/350 |
| 5,702,959 | A * | 12/1997 | Hutter et al. ........... 438/201 |
| 6,399,990 | B1 * | 6/2002 | Brennan et al. ........... 257/355 |
| 6,455,902 | B1 * | 9/2002 | Voldman ........... 257/378 |
| 6,586,780 | B1 * | 7/2003 | Terashima ........... 257/140 |
| 2005/0258496 | A1 * | 11/2005 | Tsuchiko ........... 257/378 |
| 2006/0076645 | A1 * | 4/2006 | Algotsson et al. ........... 257/566 |

* cited by examiner

*Primary Examiner* — David S Blum
(74) *Attorney, Agent, or Firm* — Jacqueline J. Garner; Wade J. Brady, III; Frederick J. Telecky, Jr.

(57) ABSTRACT

An n-type isolation structure is disclosed which includes an n-type BISO layer in combination with a shallow n-well, in an IC. The n-type BISO layer is formed by implanting n-type dopants into a p-type IC substrate in addition to a conventional n-type buried layer (NBL), prior to growth of a p-type epitaxial layer. The n-type dopants in the BISO implanted layer diffuse upward from the p-type substrate to between one-third and two-thirds of the thickness of the p-type epitaxial layer. The shallow n-type well extends from a top surface of the p-type epitaxial layer to the n-type BISO layer, forming a continuous n-type isolation structure from the top surface of the p-type epitaxial layer to the p-type substrate. The width of the n-type BISO layer may be less than the thickness of the epitaxial layer, and may be used alone or with the NBL to isolate components in the IC.

20 Claims, 23 Drawing Sheets

US 8,134,212 B2

IMPLANTED WELL BREAKDOWN IN HIGH VOLTAGE DEVICES

FIELD OF THE INVENTION

This invention relates to the field of integrated circuits. More particularly, this invention relates to methods to isolate high voltage components in integrated circuits.

BACKGROUND OF THE INVENTION

It is desirable to incorporate transistors and other components capable of operating at voltages above 30 volts, commonly known as high voltage components, in integrated circuits (ICs) which contain other components operating at less than 10 volts. It is furthermore desirable to reduce the area required for isolation of high voltage components in ICs in order to reduce manufacturing costs. High voltage isolation features such as deep n-sinkers and deep n-wells undesirably consume significant area.

SUMMARY OF THE INVENTION

This Summary is provided to comply with 37 C.F.R. §1.73, requiring a summary of the invention briefly indicating the nature and substance of the invention. It is submitted with the understanding that it will not be used to interpret or limit the scope or meaning of the claims.

The instant invention provides an n-type isolation structure which includes an n-type buried isolation (BISO) layer in combination with a shallow n-well, in an integrated circuit (IC). The n-type BISO layer is formed by implanting n-type dopants into a p-type IC substrate to form a BISO implanted layer in addition to a conventional n-type buried layer (NBL). A p-type epitaxial layer is formed on the top surface of the p-type substrate, causing the n-type dopants in the BISO implanted layer to diffuse outward to form the n-type BISO layer. A dose and species of the n-type dopants is chosen so that the n-type BISO layer extends from the p-type substrate to between one-third and two-thirds of the thickness of the p-type epitaxial layer. Furthermore, vertical and lateral diffusion distances of the n-type BISO layer dopants are greater than the NBL dopants. The shallow n-type well, formed during subsequent processing, extends from a top surface of the p-type epitaxial layer to the n-type BISO layer, forming a continuous n-type isolation structure from the top surface of the p-type epitaxial layer to the p-type substrate.

In a first embodiment, the isolation structure isolates a high voltage component formed in the shallow n-well. In a second embodiment, the isolation structure overlaps the NBL to isolate a p-type region of the epitaxial layer from the surrounding p-type epitaxial layer and the p-type substrate. In a third embodiment, the isolation structure overlaps the NBL to isolate a p-type region of the epitaxial layer to support an n-channel metal oxide semiconductor (NMOS) transistor and supports a p-channel metal oxide semiconductor (PMOS) transistor in the shallow n-well. In a fourth embodiment, the isolation structure provides a guard ring around a region in the epitaxial layer. In a fifth embodiment, the isolation structure provides lateral isolation of a shallow p-well. In a sixth embodiment, the isolation structure overlaps a buried collector in an NPN bipolar transistor. The embodiments may be enhanced by adding a p-type counter-doping layer laterally overlapping the n-type BISO layer to reduce lateral extents of the n-type BISO layer.

DETAILED DESCRIPTION

Figure 1A:
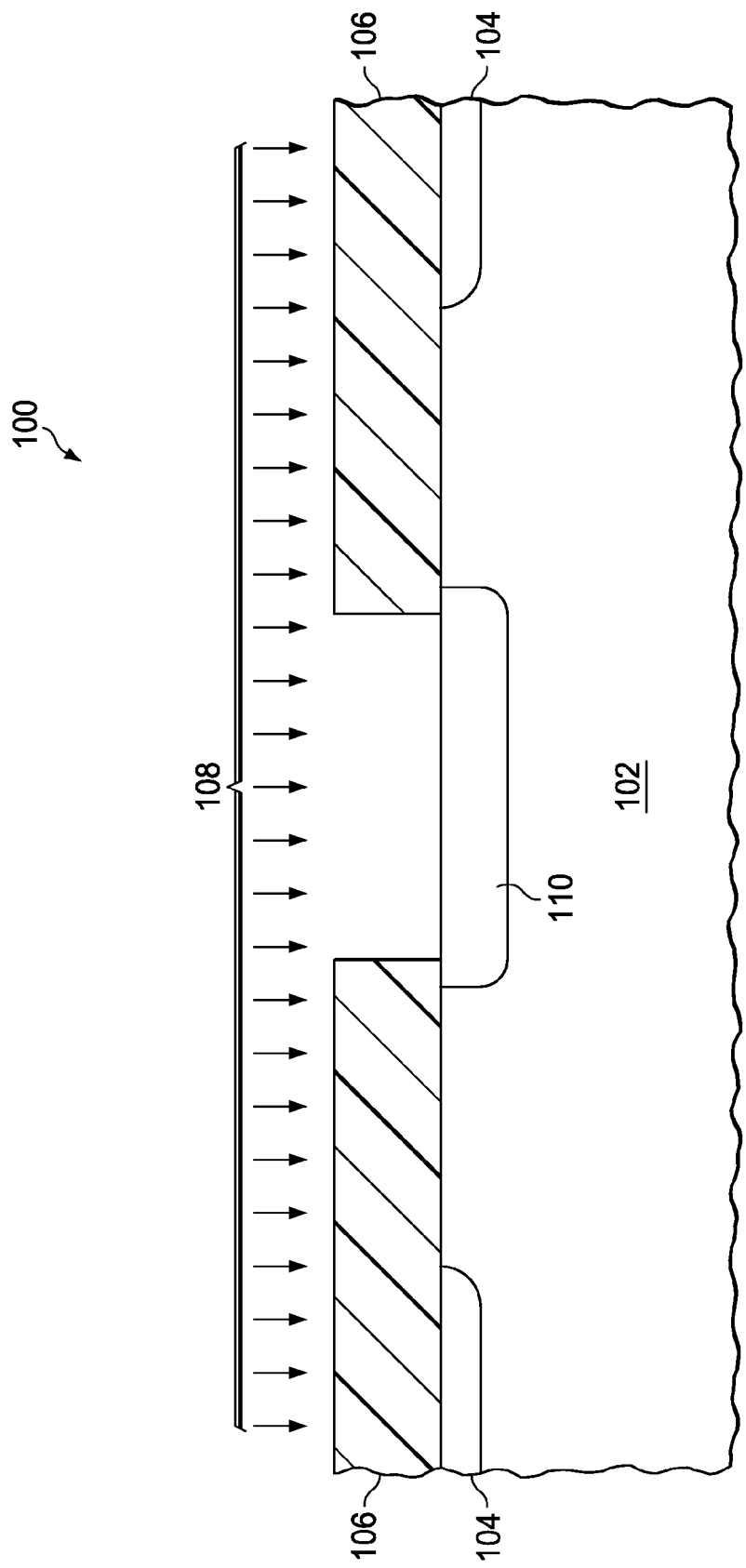
FIG. 1A through FIG. 1D are cross-sections of an IC containing the first embodiment of a combination of an n-type BISO layer and a shallow n-well, depicted in subsequent stages of fabrication.

The present invention is described with reference to the attached figures, wherein like reference numerals are used throughout the figures to designate similar or equivalent elements. The figures are not drawn to scale and they are provided merely to illustrate the invention. Several aspects of the invention are described below with reference to example applications for illustration. It should be understood that numerous specific details, relationships, and methods are set forth to provide a full understanding of the invention. One skilled in the relevant art, however, will readily recognize that the invention can be practiced without one or more of the specific details or with other methods. In other instances, well-known structures or operations are not shown in detail to avoid obscuring the invention. The present invention is not limited by the illustrated ordering of acts or events, as some acts may occur in different orders and/or concurrently with other acts or events. Furthermore, not all illustrated acts or events are required to implement a methodology in accordance with the present invention.

The instant invention provides an n-type isolation structure which includes an n-type buried isolation (BISO) layer in combination with a shallow n-type well, commonly known as a shallow n-well, in an integrated circuit (IC). The n-type BISO layer is formed by implanting n-type dopants into a p-type IC substrate to form a BISO implanted layer in addition to a conventional n-type buried layer (NBL), often used for a low resistance conductive layer under a component in the IC. The n-type dopants in the BISO implanted layer are diffused outward by a BISO anneal process. A p-type epitaxial layer is formed on a top surface of the p-type substrate, causing the n-type dopants in the BISO implanted layer to further diffuse outward to form the n-type BISO layer. Processes such as formation of field oxide cause further diffusion of the n-type dopants in the n-type BISO layer. A dose and species of the n-type dopants is chosen so that the n-type BISO layer extends from the p-type substrate to between one-third and two-thirds a thickness of the p-type epitaxial layer. Furthermore, vertical and lateral extents of diffusion of the n-type dopants in the n-type BISO layer are greater than vertical and lateral extents of diffusion of the NBL. The shallow n-well, formed during subsequent processing, extends from a top surface of the p-type epitaxial layer to the n-type BISO layer, but does not extend to the NBL or to an interface between the p-type substrate and the p-type epitaxial layer. A dopant concentration in the shallow n-well supports formation of p-channel metal oxide semiconductor (PMOS) transistors.

In a first embodiment, the combination of the n-type BISO layer and the shallow n-well may be used to isolate a high voltage component formed in the shallow n-well, for example a high voltage PMOS transistor.

In a second embodiment, the combination of the n-type BISO layer and the shallow n-well may be formed around a region of the p-type epitaxial layer over the NBL to isolate the region from the surrounding p-type epitaxial layer and the p-type substrate.

In a third embodiment, the combination of the n-type BISO layer and the shallow n-well overlaps the NBL to isolate a p-type region of the epitaxial layer to support an n-channel metal oxide semiconductor (NMOS) transistor and supports a PMOS transistor in the shallow n-well.

In a fourth embodiment, the combination of the n-type BISO layer and the shallow n-well may be formed around a region of the p-type epitaxial layer to provide a guard ring for a component inside the surrounded region.

In a fifth embodiment, the combination of the n-type BISO layer and the shallow n-well may provide lateral isolation of a shallow p-well while supporting components in the shallow n-well in close proximity to the isolated shallow p-well.

In a sixth embodiment, the isolation structure overlaps a buried collector in an NPN bipolar transistor.

The embodiments recited above may be enhanced by adding a p-type counter-doping layer laterally adjacent to the n-type BISO layer to reduce lateral extents of the n-type BISO layer, thereby desirably reducing area consumed by the inventive combination of the n-type BISO layer and the shallow n-well.

FIG. 1A through FIG. 1D are cross-sections of an IC containing the first embodiment of a combination of an n-type BISO layer and a shallow n-well, depicted in subsequent stages of fabrication. Referring to FIG. 1A, the IC 100 is formed in a p-type substrate 102, typically single crystal silicon with an electrical resistivity between 0.001 and 10 ohm-cm. N-type buried layer (NBL) implanted regions 104 are formed in the p-type substrate 102 by known NBL methods, typically including ion implanting an NBL set of n-type dopants such as antimony at doses between $3 \cdot 10^{14}$ and $3 \cdot 10^{16}$ atoms/cm$^2$. An NBL anneal operation, for example 180 minutes at 1150 C or 80 minutes at 1200 C, may be performed to diffuse the NBL dopants to a partial extent of a final NBL region. A BISO layer photoresist pattern 106 is formed on a top surface of the p-type substrate 102 which exposes an area for a BISO layer. A BISO layer set of n-type dopants 108, preferably phosphorus, and possibly including arsenic, is ion implanted, preferably at a dose between $1 \cdot 10^{13}$ and $1 \cdot 10^{15}$ atoms/cm$^2$, through the exposed area in the BISO layer photoresist pattern 106 to form a BISO layer implanted region 110 in a top region of the p-type substrate 102. A BISO anneal operation, for example 30 minutes at 1050 C, is performed to diffuse the BISO dopants to a partial extent of a final BISO layer region. Thermal profiles of the NBL anneal operation and the BISO anneal operation may be adjusted to provide desired extents of the final NBL region and the final BISO layer region.

Figure 1B:
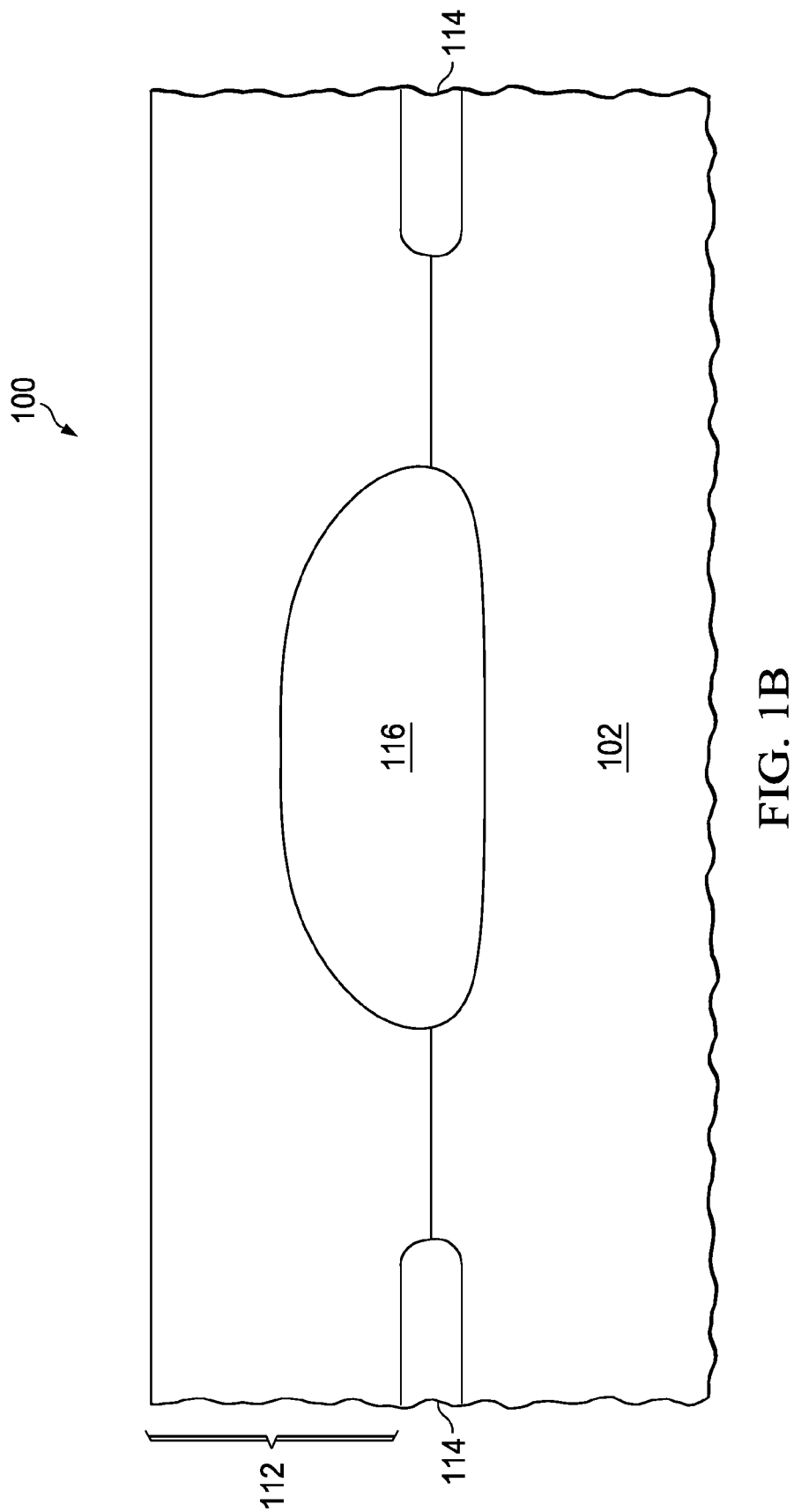

FIG. 1B depicts the IC 100 after a p-type epitaxial layer 112 is formed on the top surface of the p-type substrate 102 using known epitaxial growth methods. The p-type epitaxial layer 112 is typically 2 to 6 microns thick, but may be thicker if circuit operation at higher voltage is desired. A typical thermal profile of the epitaxial growth process is 3 minutes at 1180 C. During the epitaxial growth process, the NBL dopants diffuse upward into the p-type epitaxial layer 112, downward into the p-type substrate 102 and laterally to form NBL regions 1 14. Also during the epitaxial growth process, the BISO layer dopants diffuse upward into the p-type epitaxial layer 112, downward into the p-type substrate 102 and laterally to form a BISO layer region 116. The BISO layer dopants diffuse upward a greater distance than the NBL dopants, due to a higher diffusivity of the BISO layer dopant species.

Figure 1C:
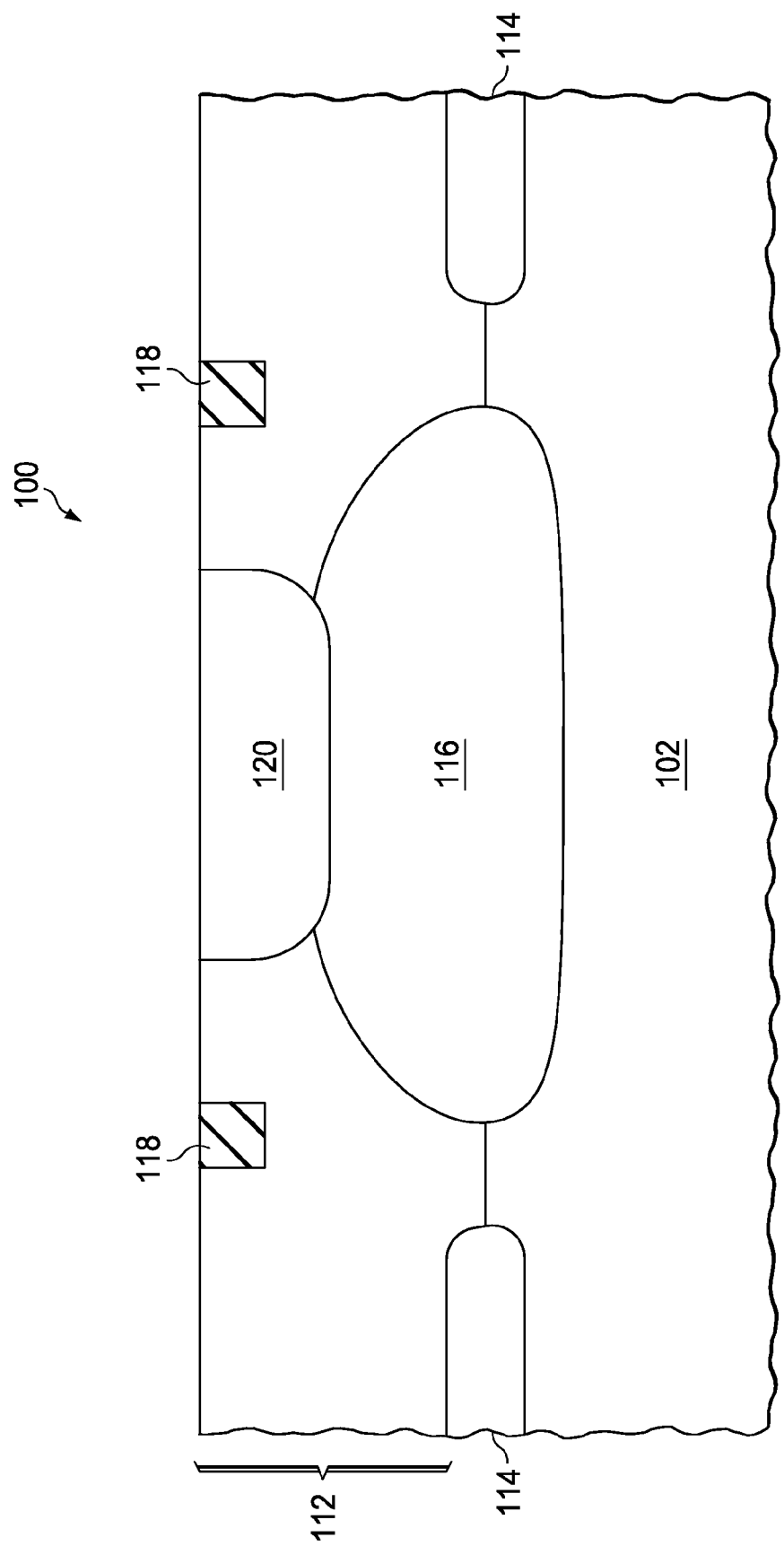

FIG. 1C depicts the IC 100 at a subsequent stage of fabrication. Deep n-type isolation regions, commonly known as n-sinkers, not shown in FIG. 1C for clarity, are formed by ion implanting an n-sinker set of n-type dopants into n-sinker areas of the p-type epitaxial layer 112 followed by an n-sinker anneal process with a typical thermal profile of 180 to 300 minutes at 1100 C to 1150 C. Elements of field oxide 118 are formed by a shallow trench isolation (STI) process sequence, in which trenches, commonly 200 to 500 nanometers deep, are etched into the IC 100, electrically passivated, commonly by growing a thermal oxide layer on sidewalls of the trenches, commonly annealed for 30 to 180 minutes at 1000 C to 1150 C, and filled with insulating material, typically silicon dioxide, commonly by a high density plasma (HDP) process or an ozone based thermal chemical vapor deposition (CVD) process, also known as the high aspect ratio process (HARP). During the n-sinker anneal process and the STI anneal process, the BISO layer dopants diffuse further upward into the p-type epitaxial layer 112. The shallow n-well 120 is preferably formed by known n-well methods, including ion implanting an n-well set of n-type dopants, preferably phosphorus, and possibly arsenic, preferably at a total dose between $1 \cdot 10^{13}$ and $3 \cdot 10^{14}$ atoms/cm$^2$, into an area of the p-type epitaxial layer 112 defined for the shallow n-well 120, followed by a rapid thermal anneal process to activate a portion of the n-well set of n-type dopants. The shallow n-well 120 overlaps a top surface of the BISO layer region 116. In a preferred embodiment, the BISO layer region 116 extends upward from the p-type substrate 102 between one-third and two-thirds of the thickness of the p-type epitaxial layer 112. In many instances, the p-type substrate 102 has a higher doping density than the p-type epitaxial layer 112, resulting is a downward extension of the BISO layer region 116 into the p-type substrate 102 that is less than the upward extension of the BISO layer region 116 into the p-type epitaxial layer 112. In other instances, the p-type substrate 102 has a lower doping density than the p-type epitaxial layer 112, resulting is a downward extension of the BISO layer region 116 into the p-type substrate 102 that is greater than the upward extension of the BISO layer region 116 into the p-type epitaxial layer 112.

Figure 1D:
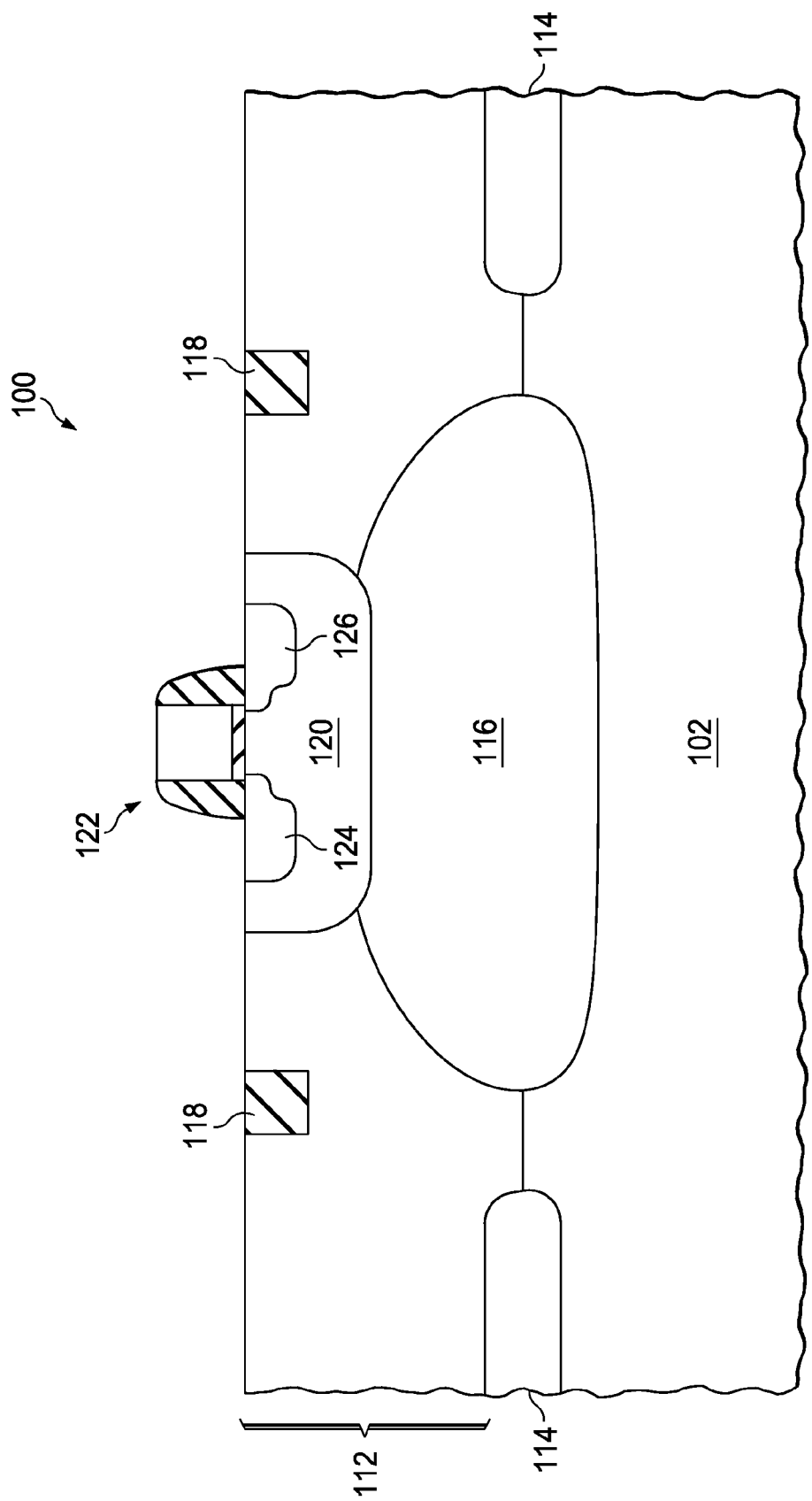

FIG. 1D depicts the IC 100 after formation of a PMOS transistor 122 in the shallow n-well 120. The PMOS transistor 122 is formed using known methods, and includes a source region 124 and a drain region 126. The combination of the shallow n-well 120 and the BISO layer region 116 provide a reduced junction gradient to the p-type epitaxial layer 112 so that the shallow n-well 120, which forms a back gate of the PMOS transistor 122, may be biased as much as 50 volts with respect to the p-type substrate 102. Back gates of PMOS transistors in shallow n-wells with no BISO layers typically may not be biased past 30 volts without causing breakdown to the p-type epitaxial layer 112.

The first embodiment discussed in reference to FIG. 1A through FIG. 1D is furthermore advantageous because less lateral area in the IC 100 is consumed to provide 50 volt operation for the PMOS transistor 122 than other isolation configurations, such as deep n-wells which extend from the top surface of the p-type epitaxial layer 112 to the p-type substrate 102.

Figure 2A:
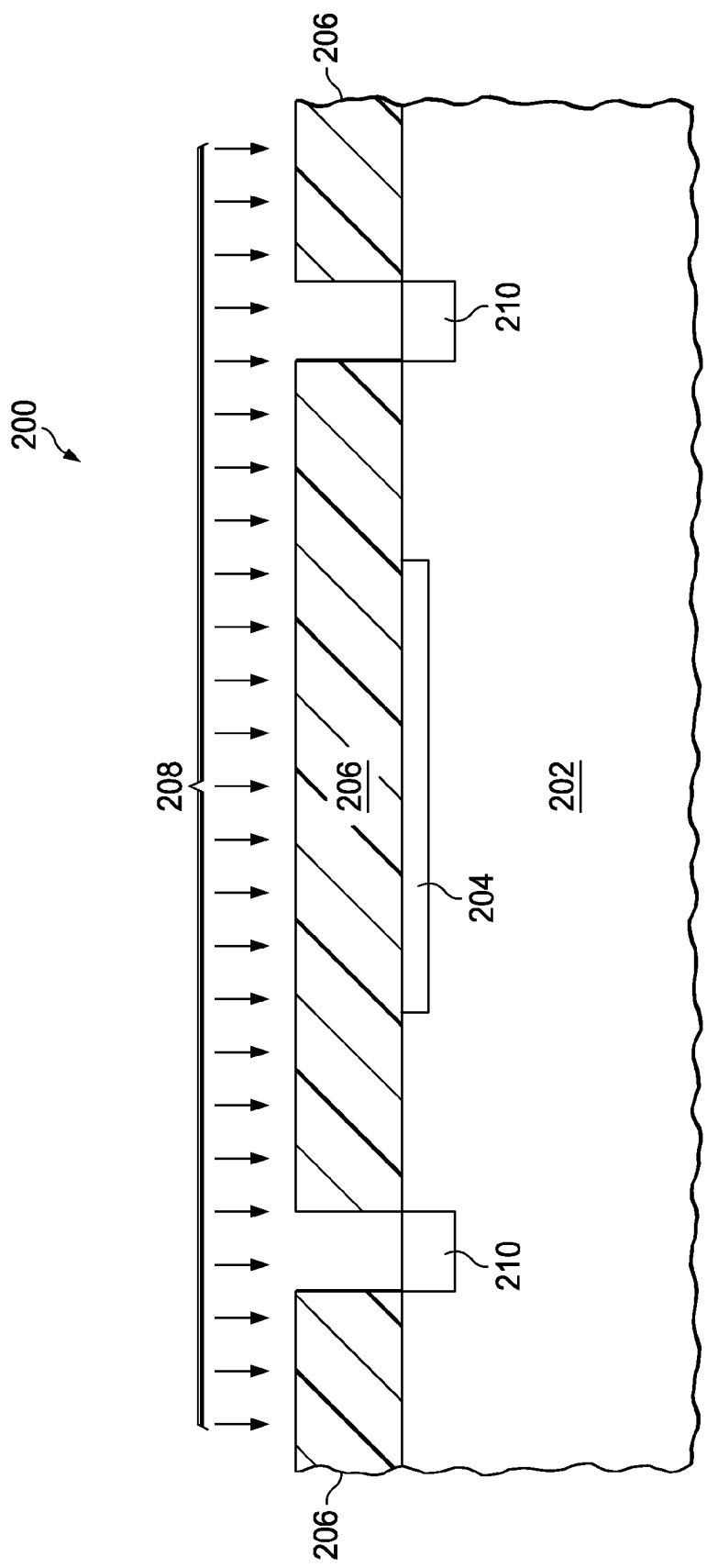
FIG. 2A through FIG. 2D are cross-sections of an IC containing the second embodiment of a combination of an n-type BISO layer and a shallow n-well, depicted in subsequent stages of fabrication.

FIG. 2A through FIG. 2D are cross-sections of an IC containing the second embodiment of a combination of an n-type BISO layer and a shallow n-well, depicted in subsequent stages of fabrication. Referring to FIG. 2A, the IC 200 is formed in a p-type substrate 202, typically single crystal silicon with an electrical resistivity between 0.001 and 10 ohm-cm. An NBL implanted region 204 is formed in the p-type substrate 202 under a region to be isolated, by known NBL methods as described in reference to FIG. 1A. A BISO layer photoresist pattern 206 is formed on a top surface of the p-type substrate 202 which exposes an area for a BISO layer. The area defined for the BISO layer is continuous around a lateral boundary of the NBL, and may overlap the NBL implanted region 204. A BISO layer set of n-type dopants 208, preferably phosphorus, and possibly including arsenic, is ion implanted, preferably at a dose between $1 \cdot 10^{13}$ and $1 \cdot 10^{15}$ atoms/cm$^2$, through the exposed area in the BISO layer photoresist pattern 206 to form a BISO layer implanted region 210 in a top region of the p-type substrate 202. The BISO layer implanted region 210 is continuous around a lateral boundary of the NBL implanted region 204.

Figure 2B:
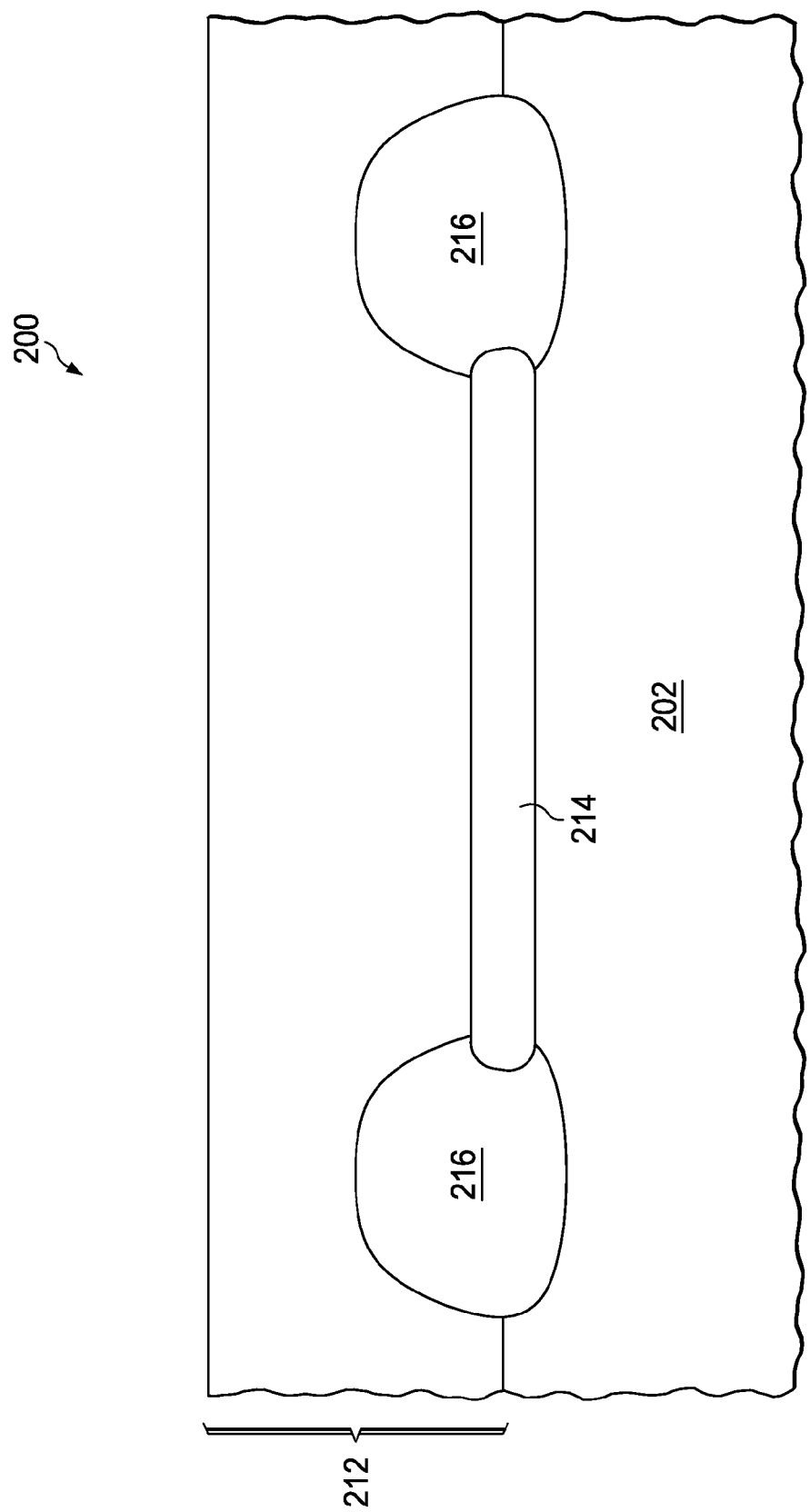

FIG. 2B depicts the IC 200 after a p-type epitaxial layer 212 is formed on the top surface of the p-type substrate 202 using known epitaxial growth methods. The p-type epitaxial layer 212 is typically 2 to 6 microns thick, but may be thicker if circuit operation at higher voltage is desired. During the epitaxial growth process, the NBL dopants diffuse upward into the p-type epitaxial layer 212, downward into the p-type substrate 202 and laterally to form an NBL region 214. Also during the epitaxial growth process, the BISO layer dopants diffuse upward into the p-type epitaxial layer 212, downward into the p-type substrate 202 and laterally to form BISO layer regions 216 which overlap the NBL region 214. The BISO layer dopants diffuse upward a greater distance than the NBL dopants, due to a higher diffusivity of the BISO layer dopant species.

Figure 2C:
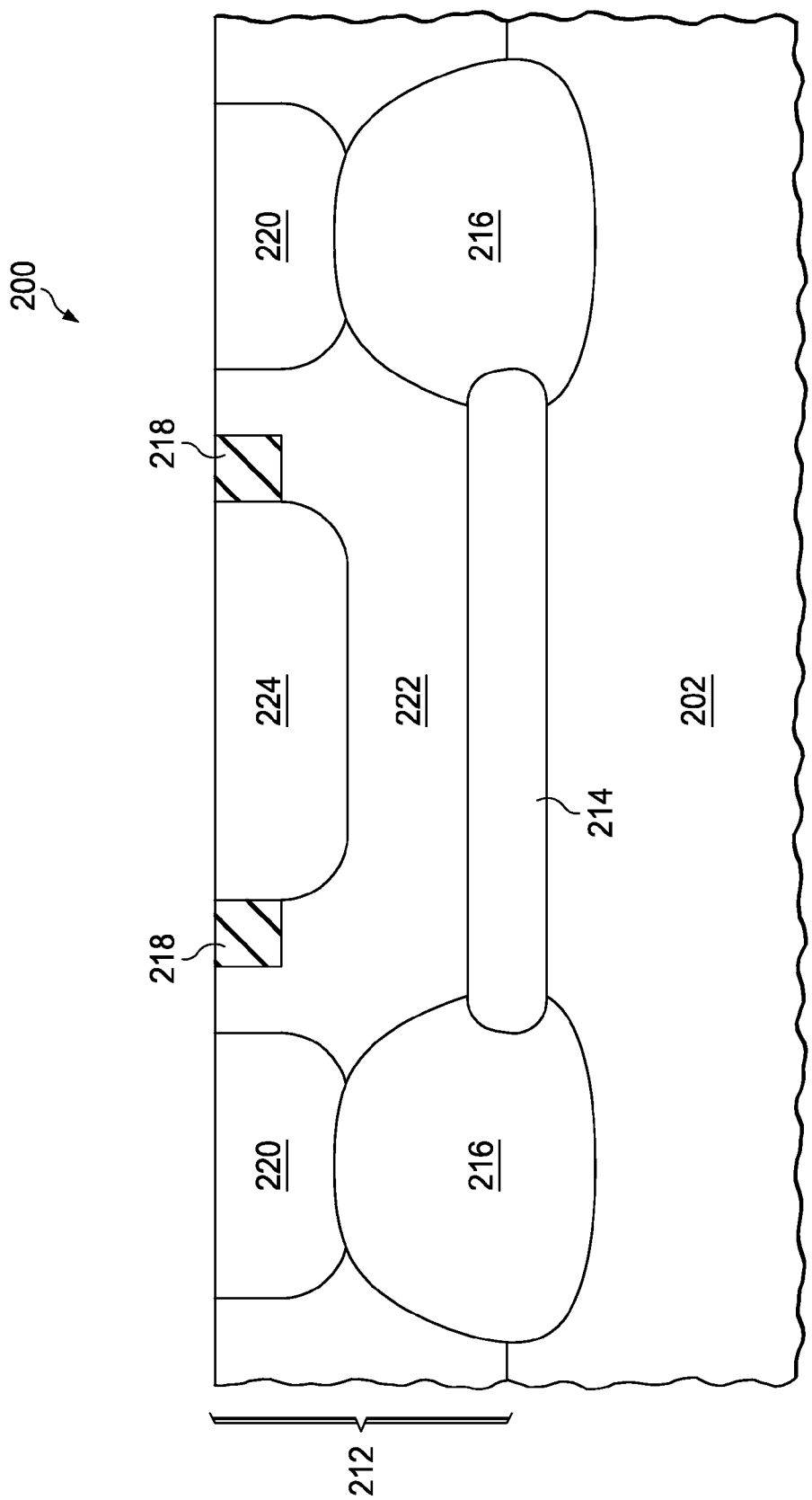

FIG. 2C depicts the IC 200 at a subsequent stage of fabrication. Elements of field oxide 218 are formed by an STI process sequence, as described in reference to FIG. 1C. A shallow n-well 220 is preferably formed by known n-well methods, including ion implanting an n-well set of n-type dopants, preferably phosphorus, and possibly arsenic, preferably at a total dose between $1 \cdot 10^{13}$ and $3 \cdot 10^{14}$ atoms/cm$^2$, into an area of the p-type epitaxial layer 212 defined for the shallow n-well 220, followed by a rapid thermal anneal process to activate a portion of the n-well set of n-type dopants. During the STI process and the rapid thermal anneal process, the BISO layer dopants diffuse further upward into the p-type epitaxial layer 212, such that the BISO layer region 216 overlaps a bottom surface of the shallow n-well 220, forming a p-type isolated region 222 above the NBL region 214. In a preferred embodiment, the BISO layer region 216 extends upward from the p-type substrate 202 between one-third and two-thirds of the thickness of the p-type epitaxial layer 212. In many instances, the p-type substrate 202 has a higher doping density than the p-type epitaxial layer 212, resulting is a downward extension of the BISO layer region 216 into the p-type substrate 202 that is less than the upward extension of the BISO layer region 216 into the p-type epitaxial layer 212. In other instances, the p-type substrate 202 has a lower doping density than the p-type epitaxial layer 212, resulting is a downward extension of the BISO layer region 216 into the p-type substrate 202 that is greater than the upward extension of the BISO layer region 216 into the p-type epitaxial layer 212. In a preferred embodiment, a lateral width of the BISO layer region 216 is less than a vertical thickness of the p-type epitaxial layer 212. An optional shallow p-well 224 is formed in the isolated region 222, for example by ion implanting a p-well set of p-type dopants, including boron and possibly gallium and/or indium, at doses from $1 \cdot 10^{11}$ to $1 \cdot 10^{14}$ atoms/cm$^2$, into the isolated region 222. A p-well photoresist pattern, not shown in FIG. 2C for clarity, is commonly used to block the p-well set of p-type dopants from regions outside the shallow p-well. The shallow p-well 224 extends from a top surface of the p-type epitaxial layer 212 to a depth typically 50 to 500 nanometers below a bottom surface of the field oxide elements 218. The ion implantation process to form the shallow p-well 224 may include additional steps to implant additional p-type dopants at shallower depths for purposes of improving NMOS transistor performance, such as threshold adjustment, leakage current reduction and suppression of parasitic bipolar operation.

Figure 2D:
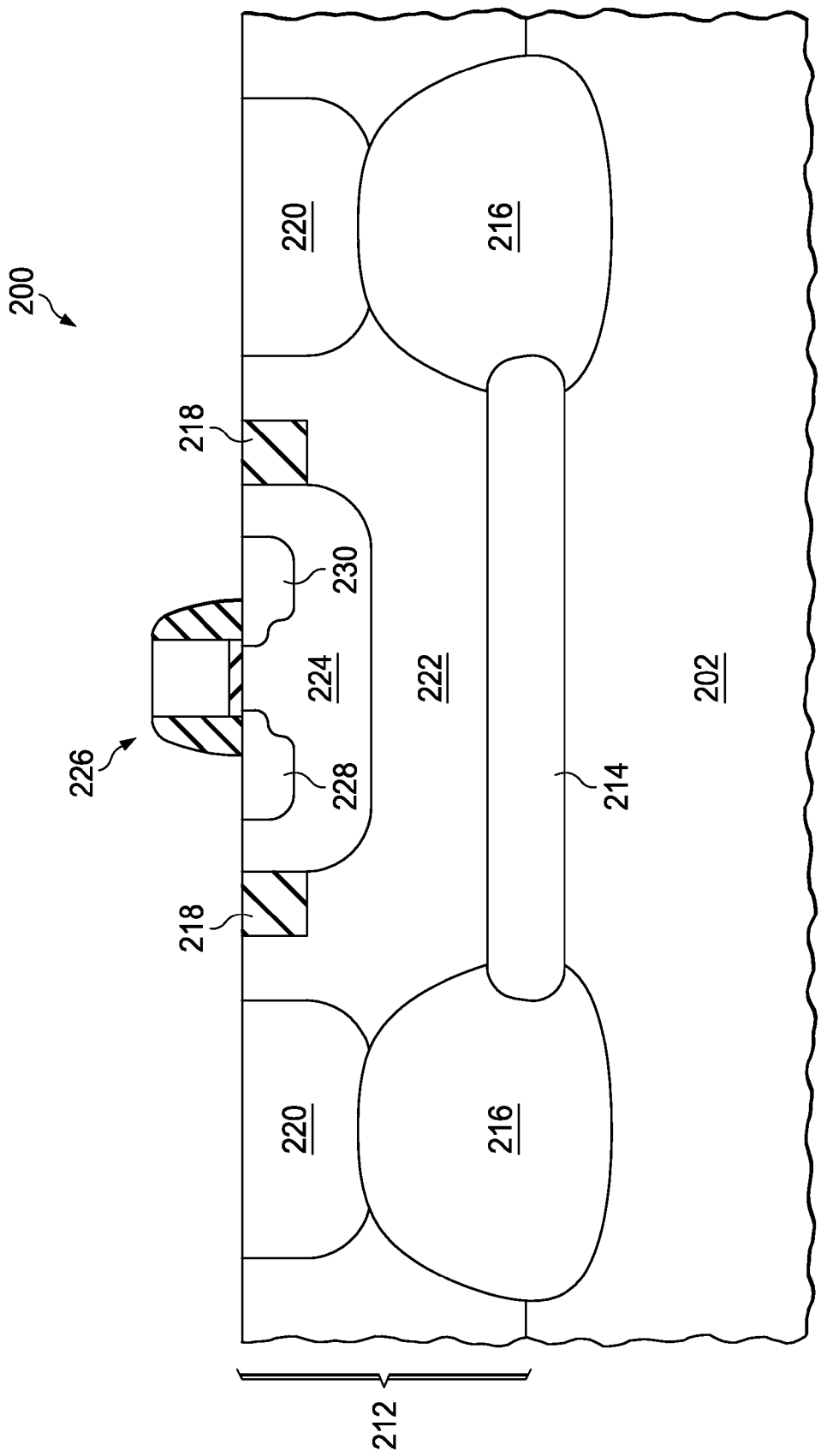

FIG. 2D depicts the IC 100 after formation of an NMOS transistor 226 in the p-type isolated region 222, furthermore in the optional shallow p-well 224, if present. The NMOS transistor 226 is formed using known methods, and includes a source region 228 and a drain region 230. The combination of the shallow n-well 220 and the BISO layer region 216 provide a reduced junction gradient to the p-type epitaxial layer 212 so that the isolated region 222, and the optional shallow p-well 224, if present, which forms a back gate of the NMOS transistor 226, may be biased as much as 50 volts with respect to the p-type substrate 202. Back gates of NMOS transistors in p-type regions isolated by conventional structures such as compensated p-wells typically may not be biased more than 10 volts without causing breakdown to the p-type epitaxial layer 212.

The second embodiment discussed in reference to FIG. 2A through FIG. 2D is advantageous because less lateral area in the IC 200 is consumed to provide 50 volt operation for the NMOS transistor 224 than other isolation configurations, such as deep n-sinkers which extend from the top surface of the p-type epitaxial layer 212 to the NBL region 214.

Figure 3:
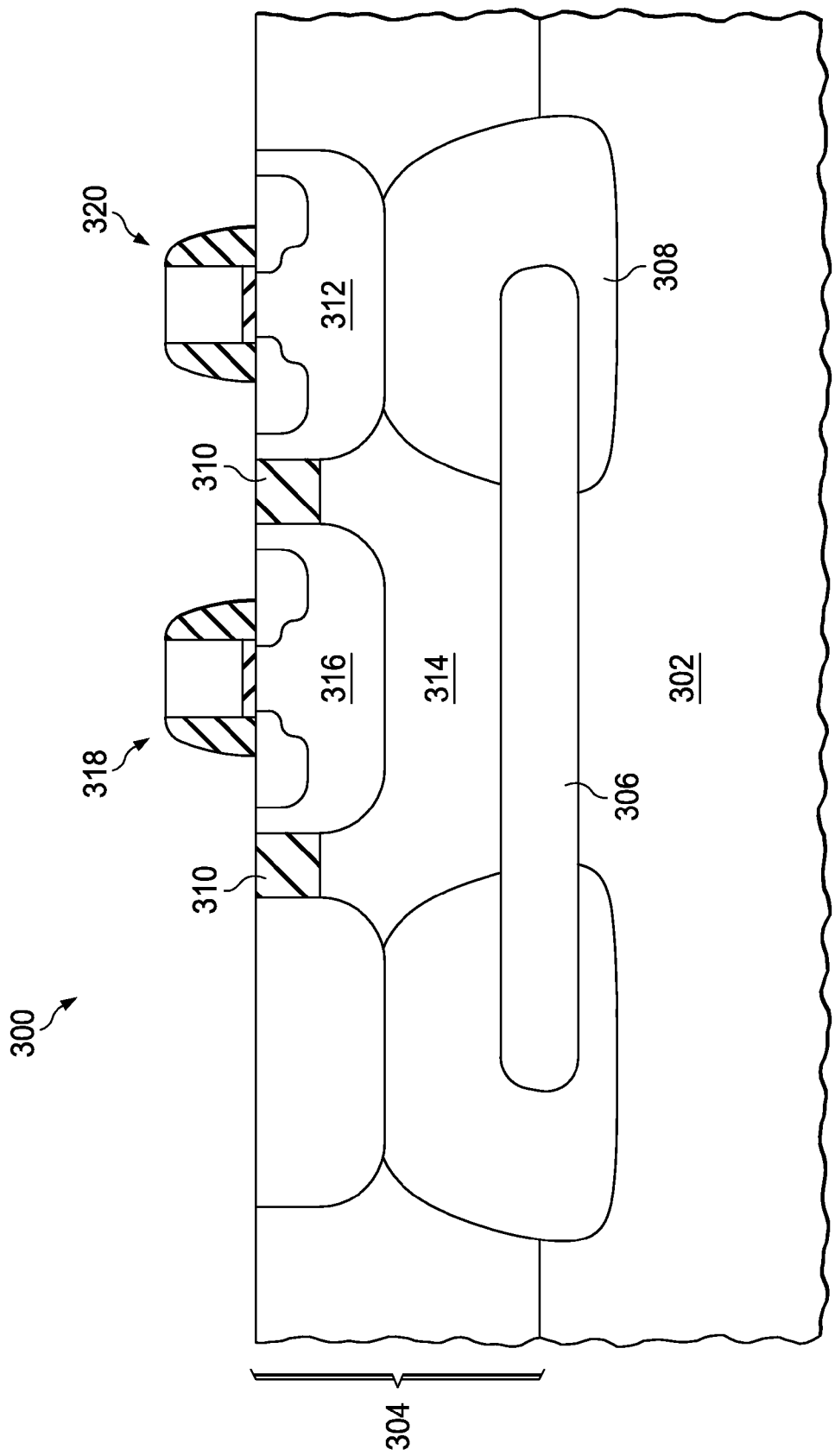
FIG. 3 is a cross-section of an IC containing the third embodiment of a combination of a combination of an n-type BISO layer and a shallow n-well.

FIG. 3 is a cross-section of an IC containing the third embodiment of a combination of an n-type BISO layer and a shallow n-well. The IC 300 is formed in a p-type substrate 302, typically single crystal silicon with an electrical resistivity between 0.001 and 10 ohm-cm. A p-type epitaxial layer 304, typically between 2 and 6 microns thick, is formed on a top surface of the substrate 302, as described in reference to FIG. 1A. An NBL region 306 is formed at the boundary between the p-type epitaxial layer 304 and the substrate 302, as described in reference to FIG. 1A through FIG. 1C. An n-type BISO layer region 308 is formed as described in reference to FIG. 1A through FIG. 1C, so as to continuously overlap a lateral boundary of the NBL region 306. In a preferred embodiment, a lateral width of the BISO layer region 308 is less than a vertical thickness of the p-type epitaxial layer 304. Elements of field oxide 310 are formed in the p-type epitaxial layer 304, by STI processes, as described in reference to FIG. 1C. A shallow n-well 312 is formed in the p-type epitaxial layer 304, as described in reference to FIG.

1C, so as to continuously overlap the BISO layer region 308, forming a p-type isolated region 314 above the NBL region 306. A shallow p-well 316 is formed in the p-type isolated region 314.

Still referring to FIG. 3, components of circuits in the IC 300 are formed using known methods, exemplified by an NMOS transistor 318 formed in the shallow p-well 316 and a PMOS transistor 320 formed in the shallow n-well 312.

During operation of the NMOS transistor 318 and PMOS transistor 320, the shallow p-well 316 and the shallow n-well 312 may be biased positively with respect to the substrate 302 up to a breakdown potential between the BISO layer 308 and p-type regions in the epitaxial layer 304 adjacent to the BISO layer 308, which may be 50 volts.

The third embodiment discussed in reference to FIG. 3 is advantageous because less lateral area in the IC 300 is consumed to provide operation of NMOS and PMOS transistors at 50 volts above the substrate than other configurations, such as isolating a p-type region using deep n-sinkers which extend from the top surface of the p-type epitaxial layer 304 to the NBL region 306.

Figure 4A:
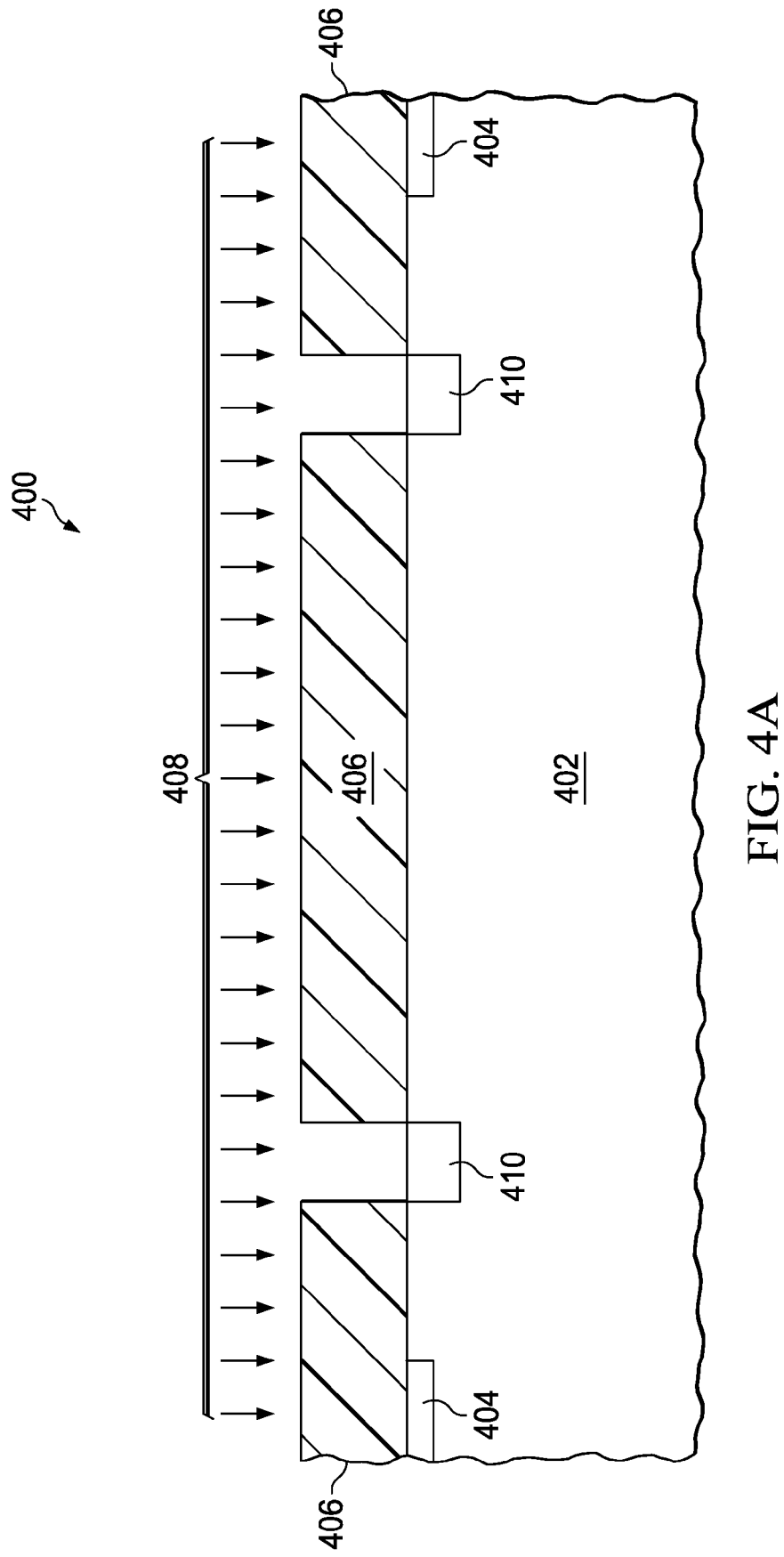
FIG. 4A through FIG. 4D are cross-sections of an IC containing the fourth embodiment of a combination of an n-type BISO layer and a shallow n-well, depicted in subsequent stages of fabrication.

FIG. 4A through FIG. 4D are cross-sections of an IC containing the fourth embodiment of a combination of an n-type BISO layer and a shallow n-well, depicted in subsequent stages of fabrication. Referring to FIG. 4A, the IC 400 is formed in a p-type substrate 402, typically single crystal silicon with an electrical resistivity between 0.001 and 10 ohm-cm. NBL implanted regions 404 are formed in the p-type substrate 402, by known NBL methods as described in reference to FIG. 1A. A BISO layer photoresist pattern 406 is formed on a top surface of the p-type substrate 402 which exposes an area for a BISO layer. The area defined for the BISO layer is continuous around a region to be isolated by a guard ring. A BISO layer set of n-type dopants 408, preferably phosphorus, and possibly including arsenic, is ion implanted, preferably at a dose between $1 \cdot 10^{13}$ and $1 \cdot 10^{15}$ atoms/cm$^2$, through the exposed area in the BISO layer photoresist pattern 406 to form a BISO layer implanted region 410 in a top region of the p-type substrate 402. The BISO layer implanted region 410 is continuous around the region to be isolated by a guard ring.

Figure 4B:
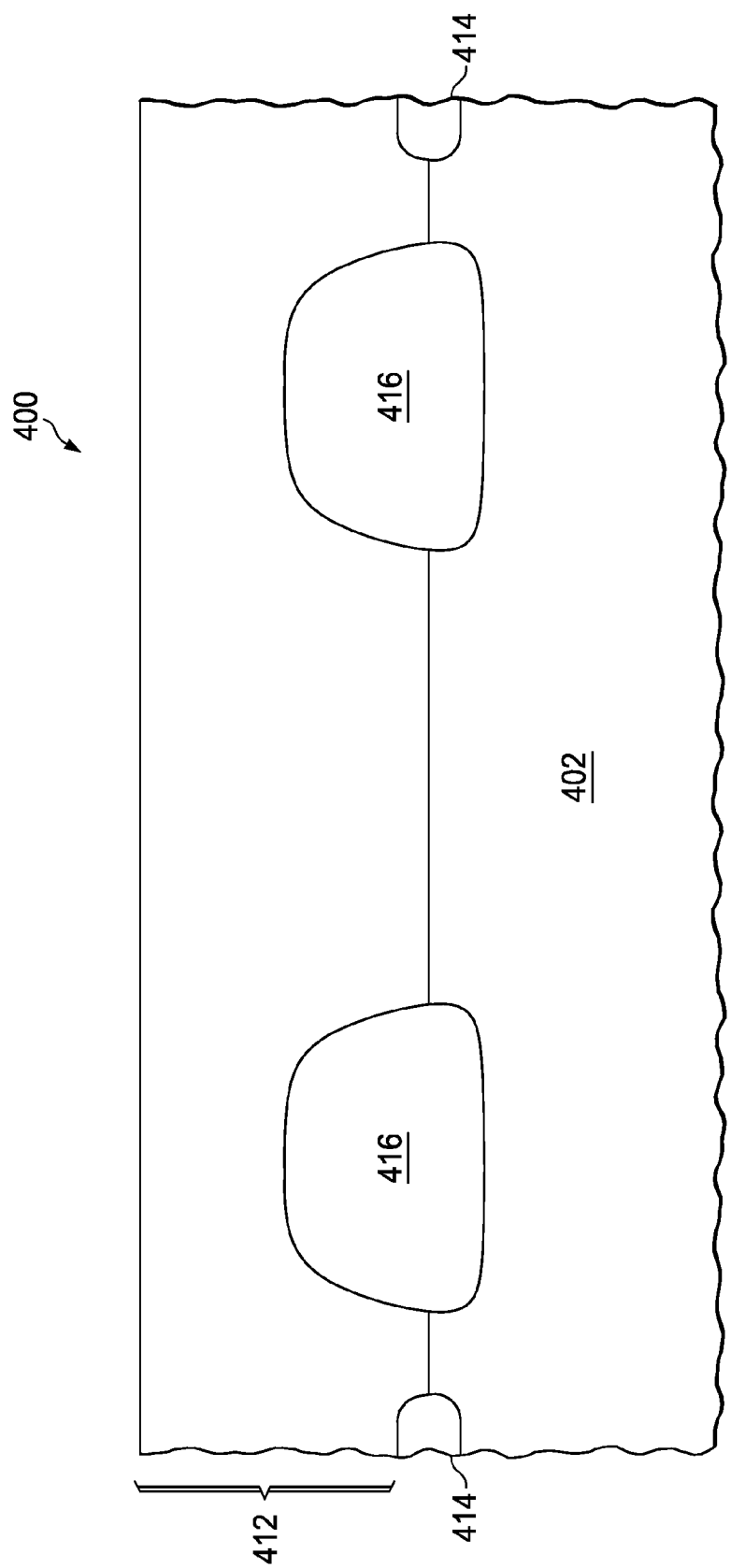

FIG. 4B depicts the IC 400 after a p-type epitaxial layer 412 is formed on the top surface of the p-type substrate 402 using known epitaxial growth methods. The p-type epitaxial layer 412 is typically 2 to 6 microns thick, but may be thicker if circuit operation at higher voltage is desired. During the epitaxial growth process, the NBL dopants diffuse upward into the p-type epitaxial layer 412, downward into the p-type substrate 402 and laterally to form NBL regions 414. Also during the epitaxial growth process, the BISO layer dopants diffuse upward into the p-type epitaxial layer 412, downward into the p-type substrate 402 and laterally to form a BISO layer region 416 which surround the region to be isolated by a guard ring. The BISO layer dopants diffuse upward a greater distance than the NBL dopants, due to a higher diffusivity of the BISO layer dopant species.

Figure 4C:
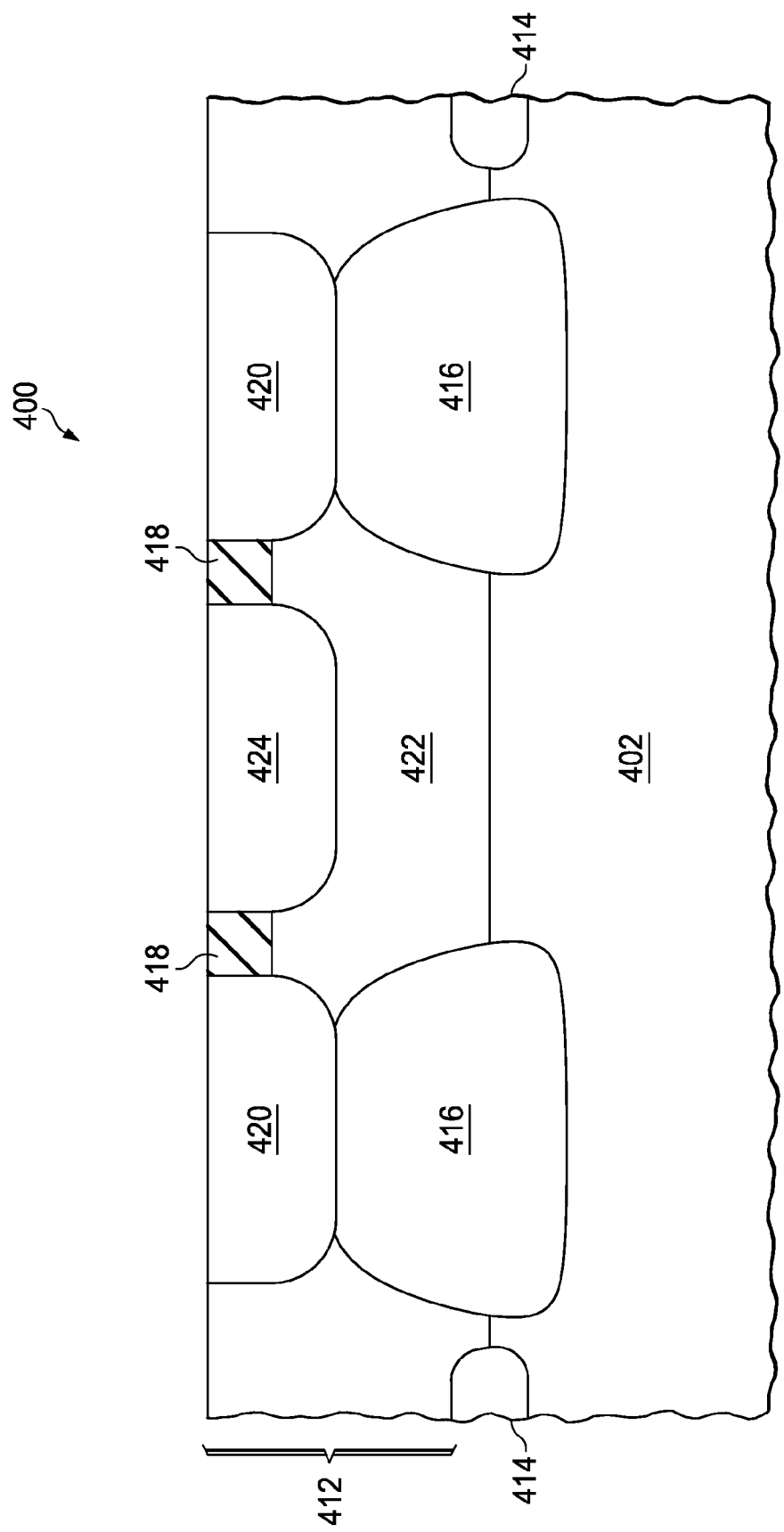

FIG. 4C depicts the IC 400 at a subsequent stage of fabrication. Elements of field oxide 418 are formed by an STI process sequence, as described in reference to FIG. 1C. A shallow n-well 420 is preferably formed by known n-well methods, including ion implanting an n-well set of n-type dopants, preferably phosphorus, and possibly arsenic, preferably at a total dose between $1 \cdot 10^{13}$ and $3 \cdot 10^{14}$ atoms/cm$^2$, into an area of the p-type epitaxial layer 412 defined for the shallow n-well 420, followed by a rapid thermal anneal process to activate a portion of the n-well set of n-type dopants. During the STI process and the rapid thermal anneal process, the BISO layer dopants diffuse further upward into the p-type epitaxial layer 412, such that the BISO layer region 416 overlaps a bottom surface of the shallow n-well 420, surrounding a p-type isolated region 422 in the epitaxial layer 412. An optional shallow well 424 may be formed in the isolated region 422 to enhance performance of components subsequently formed in the isolated region 422. In a preferred embodiment, the BISO layer region 416 extends upward from the p-type substrate 402 between one-third and two-thirds of the thickness of the p-type epitaxial layer 412. In many instances, the p-type substrate 402 has a higher doping density than the p-type epitaxial layer 412, resulting is a downward extension of the BISO layer region 416 into the p-type substrate 402 that is less than the upward extension of the BISO layer region 416 into the p-type epitaxial layer 412. In other instances, the p-type substrate 402 has a lower doping density than the p-type epitaxial layer 412, resulting is a downward extension of the BISO layer region 416 into the p-type substrate 402 that is greater than the upward extension of the BISO layer region 416 into the p-type epitaxial layer 412. In a preferred embodiment, a lateral width of the BISO layer region 416 is less than a vertical thickness of the p-type epitaxial layer 412.

Figure 4D:
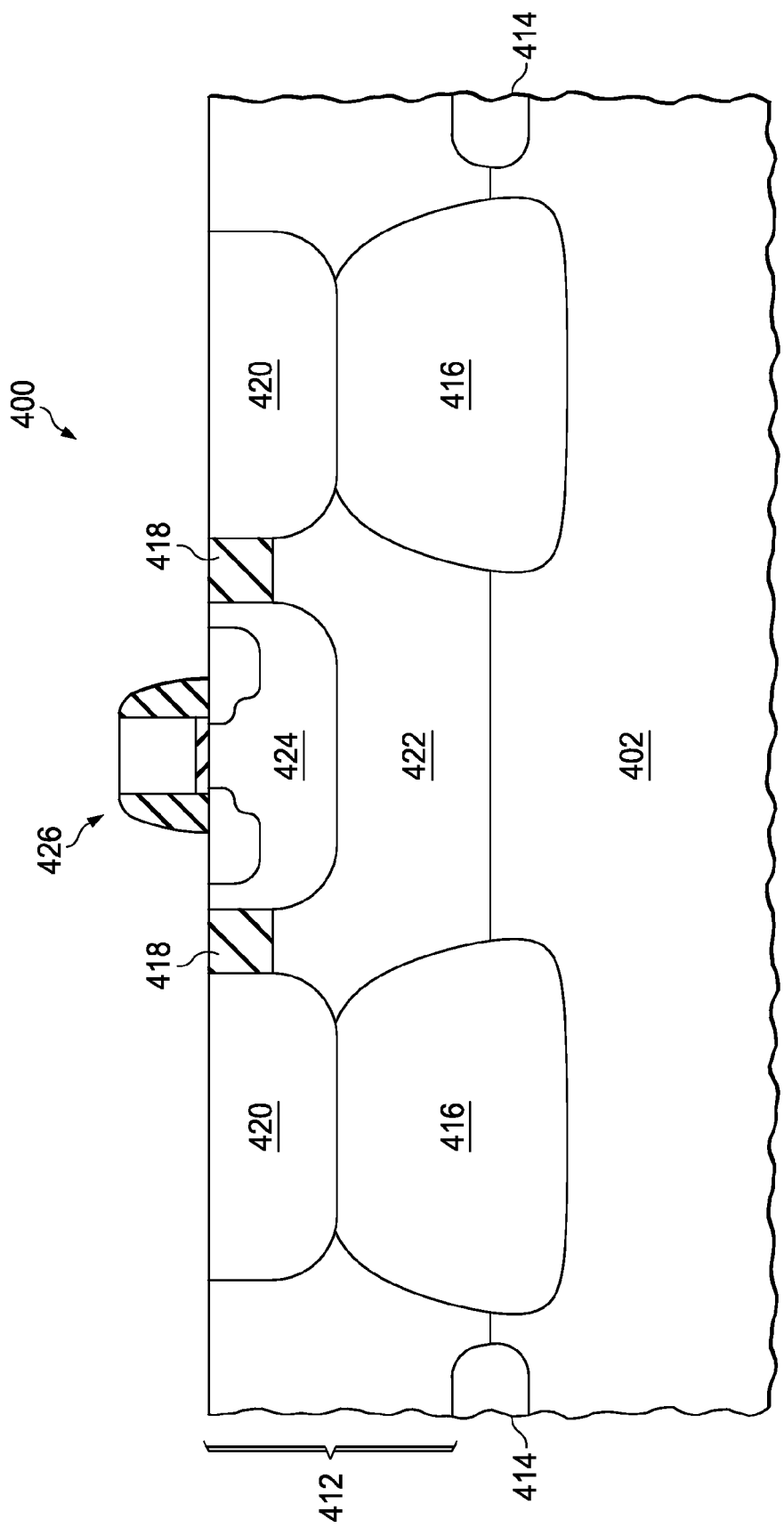

FIG. 4D depicts the IC 400 after formation of components of circuits in the IC 400 in the optional shallow well 424, exemplified by an MOS transistor 426. Components in the isolated region 422 are isolated by an n-type guard ring which includes the shallow n-well 420 and the BISO layer region 416.

The fourth embodiment discussed in reference to FIG. 4A through FIG. 4D is advantageous because less lateral area in the IC 400 is consumed to provide a guard ring around the isolated region 422 than other isolation configurations, such as deep n-sinkers which extend from the top surface of the p-type epitaxial layer 412 to the substrate 402.

Figure 5A:
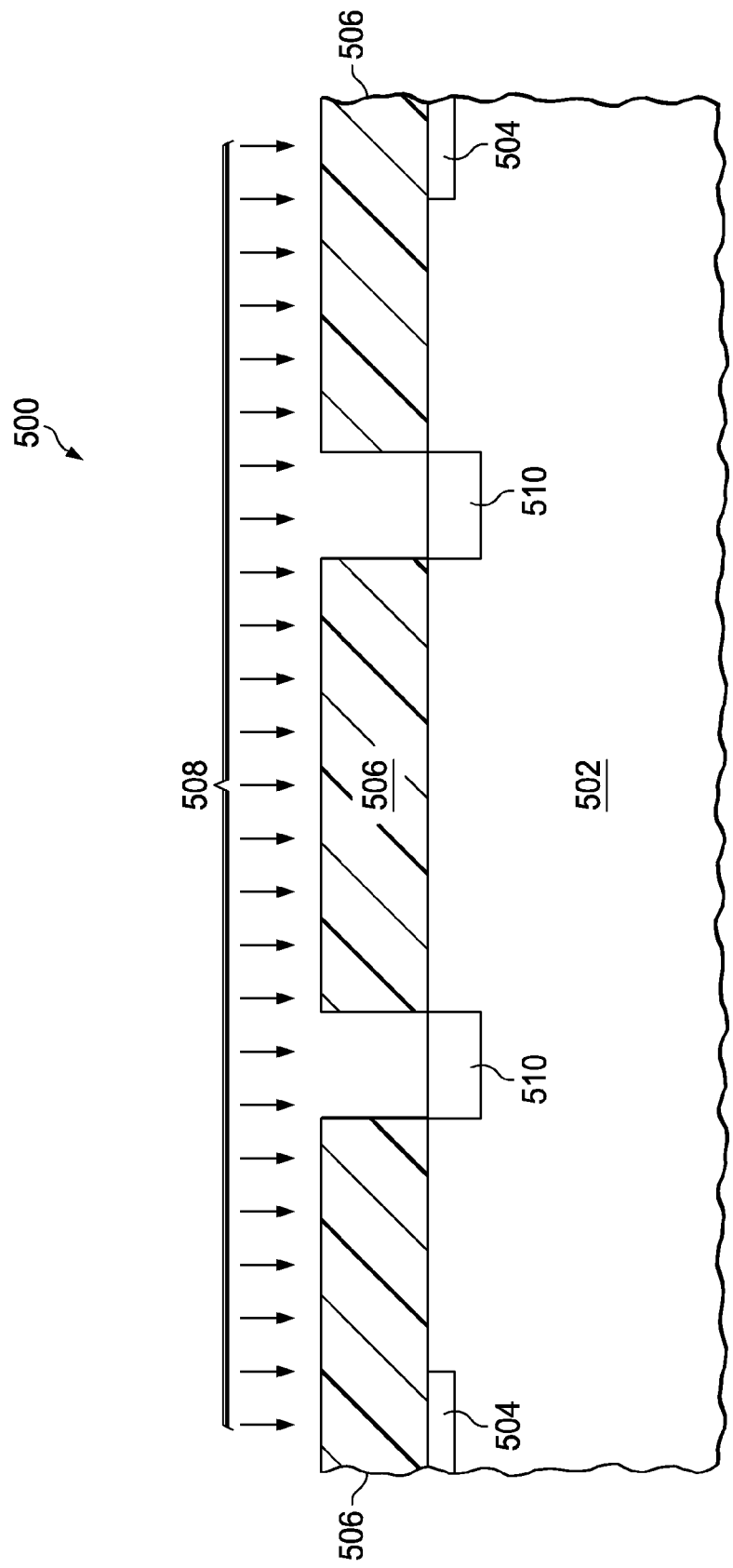
FIG. 5A through FIG. 5D are cross-sections of an IC containing the fifth embodiment of a combination of an n-type BISO layer and a shallow n-well, depicted in subsequent stages of fabrication.

FIG. 5A through FIG. 5D are cross-sections of an IC containing the fifth embodiment of a combination of an n-type BISO layer and a shallow n-well, depicted in subsequent stages of fabrication. Referring to FIG. 5A, the IC 500 is formed in a p-type substrate 502, typically single crystal silicon with an electrical resistivity between 0.001 and 10 ohm-cm. NBL implanted regions 504 are formed in the p-type substrate 502, by known NBL methods as described in reference to FIG. 1A. A BISO layer photoresist pattern 506 is formed on a top surface of the p-type substrate 502 which exposes an area for a BISO layer. The area defined for the BISO layer is continuous around a region to be isolated. A BISO layer set of n-type dopants 508, preferably phosphorus, and possibly including arsenic, is ion implanted, preferably at a dose between $1 \cdot 10^{13}$ and $1 \cdot 10^{15}$ atoms/cm$^2$, through the exposed area in the BISO layer photoresist pattern 506 to form a BISO layer implanted region 510 in a top region of the p-type substrate 502. The BISO layer implanted region 510 is continuous around the region to be isolated.

Figure 5B:
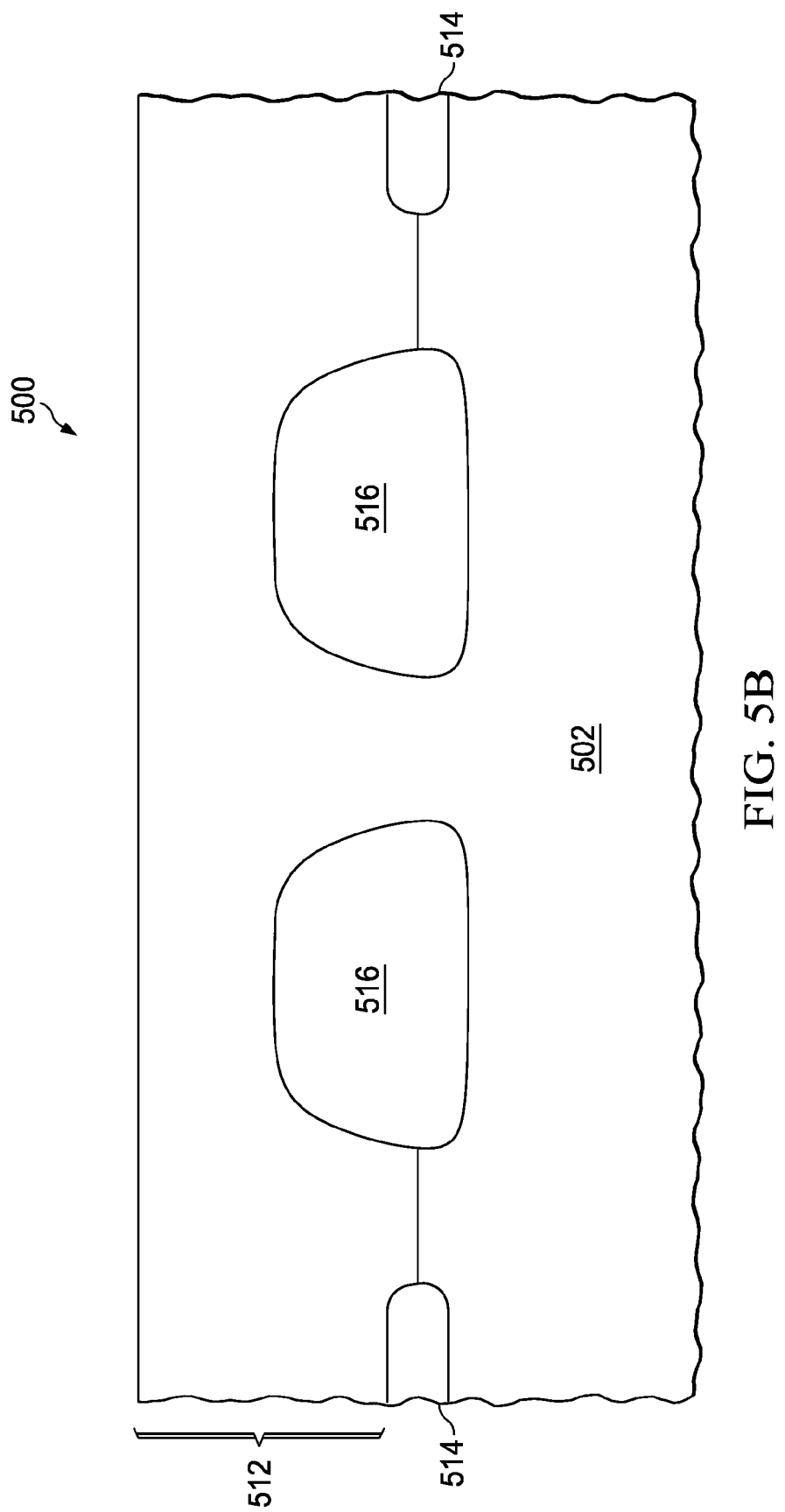

FIG. 5B depicts the IC 500 after a p-type epitaxial layer 512 is formed on the top surface of the p-type substrate 502 using known epitaxial growth methods. The p-type epitaxial layer 512 is typically 2 to 6 microns thick, but may be thicker if circuit operation at higher voltage is desired. During the epitaxial growth process, the NBL dopants diffuse upward into the p-type epitaxial layer 512, downward into the p-type substrate 502 and laterally to form NBL regions 514. Also during the epitaxial growth process, the BISO layer dopants diffuse upward into the p-type epitaxial layer 512, downward into the p-type substrate 502 and laterally to form a BISO layer region 516 which surround the region to be isolated. The BISO layer dopants diffuse upward a greater distance than the NBL dopants, due to a higher diffusivity of the BISO layer dopant species.

Figure 5C:
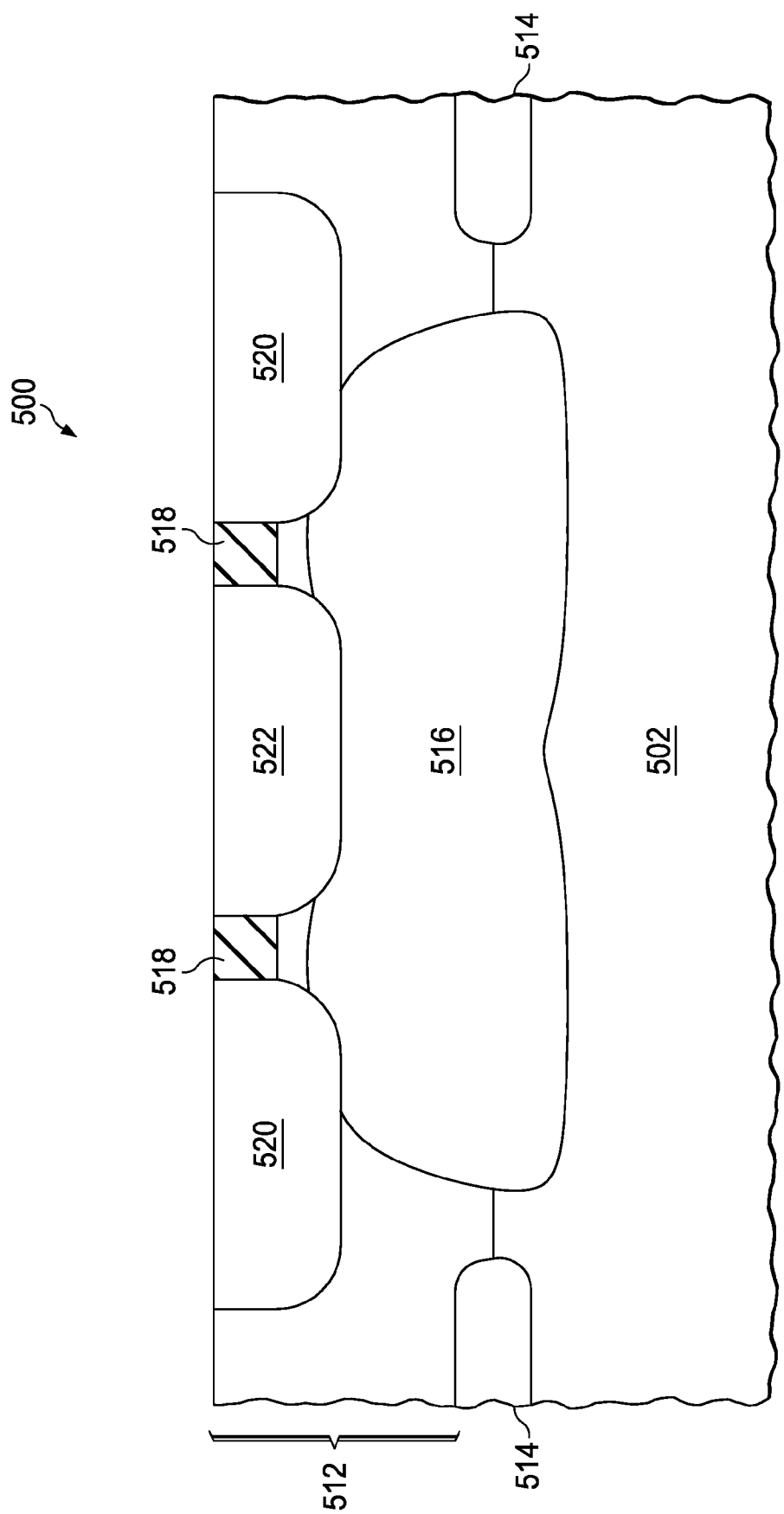

FIG. 5C depicts the IC 500 at a subsequent stage of fabrication. Elements of field oxide 518 are formed by an STI process sequence, as described in reference to FIG. 1C. A shallow n-well 520 is formed, preferably by known n-well methods, including ion implanting an n-well set of n-type dopants, preferably phosphorus, and possibly arsenic, preferably at a total dose between $1 \cdot 10^{13}$ and $3 \cdot 10^{14}$ atoms/cm$^2$, into an area of the p-type epitaxial layer 512 defined for the shallow n-well 520, which is radially offset from the BISO layer region 516, followed by a rapid thermal anneal process to activate a portion of the n-well set of n-type dopants. A shallow p-well 522 is formed in the region surrounded by the shallow n-well 520 to support components which may operate above 50 volts. During the STI process and the rapid thermal anneal process, the BISO layer dopants diffuse further upward into the p-type epitaxial layer 512, such that the BISO layer region 506 overlaps a portion of the shallow n-well 520 along an interior boundary and overlaps a portion of the shallow p-well 522 along an exterior boundary, and diffuse further laterally so that the BISO layer region 506 is continuous under the region to be isolated. In a preferred embodiment, the BISO layer region 516 extends upward from the p-type substrate 502 between one-third and two-thirds of the thickness of the p-type epitaxial layer 512. In many instances, the p-type substrate 502 has a higher doping density than the p-type epitaxial layer 512, resulting is a downward extension of the BISO layer region 516 into the p-type substrate 502 that is less than the upward extension of the BISO layer region 516 into the p-type epitaxial layer 512. In other instances, the p-type substrate 502 has a lower doping density than the p-type epitaxial layer 512, resulting is a downward extension of the BISO layer region 516 into the p-type substrate 502 that is greater than the upward extension of the BISO layer region 516 into the p-type epitaxial layer 512.

Figure 5D:
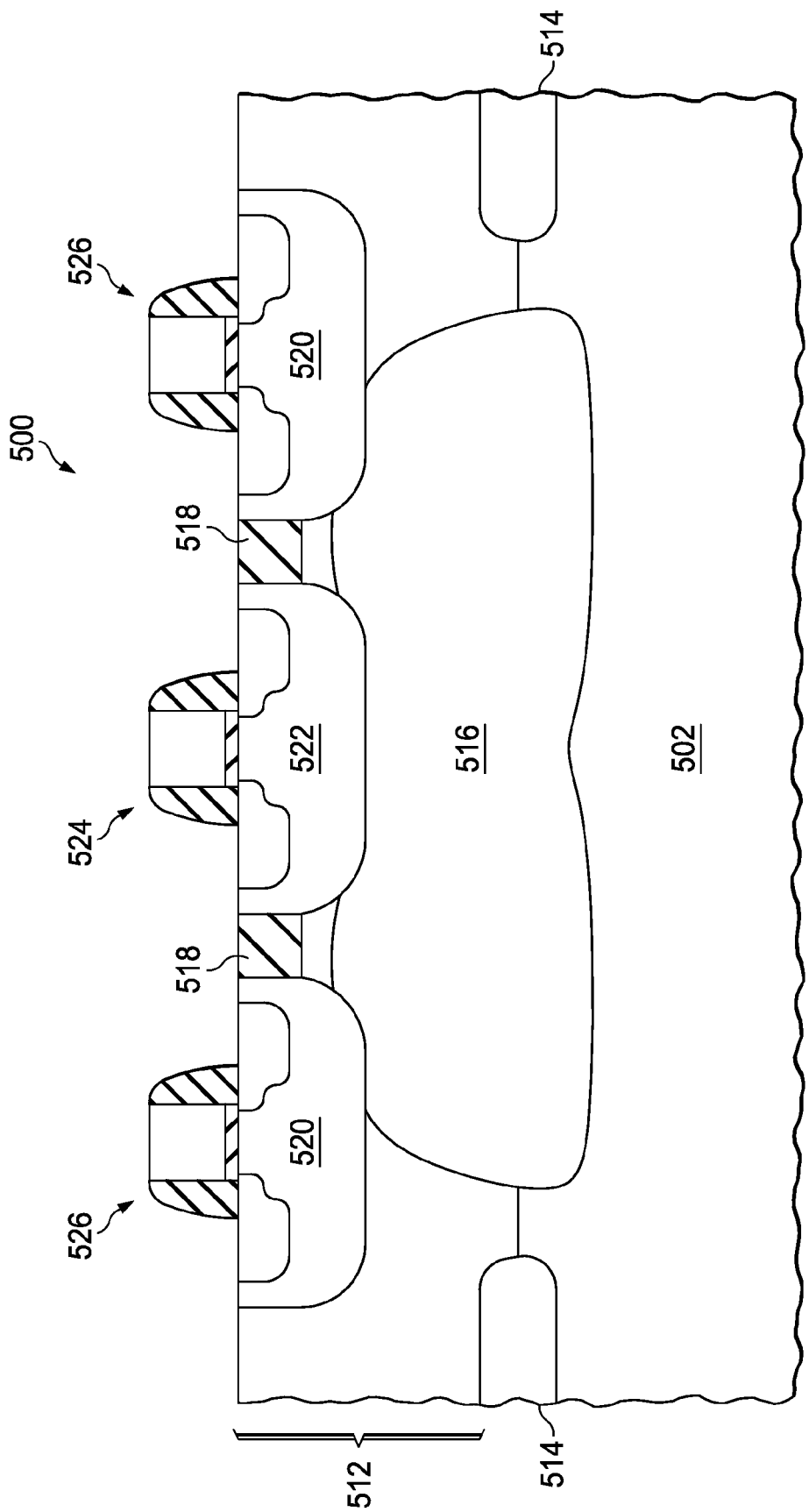

FIG. 5D depicts the IC 500 after formation of components of circuits in the shallow p-well 522 and the shallow n-well 520, exemplified by an NMOS transistor 524 in the shallow p-well 522 and PMOS transistors 526 in the shallow n-well 520. Components in the shallow p-well 522 are isolated by the combination of the shallow n-well 520 and the BISO layer region 516, and may be operated at higher potentials with respect to the substrate 502 than components in shallow p-wells which are not isolated.

The fifth embodiment discussed in reference to FIG. 5A through FIG. 5D is advantageous because high voltage components 524 in the shallow p-well 522 may be situated closer to components 526 in the shallow n-well 520 in the IC 500 than by use of other isolation configurations.

Figure 6:
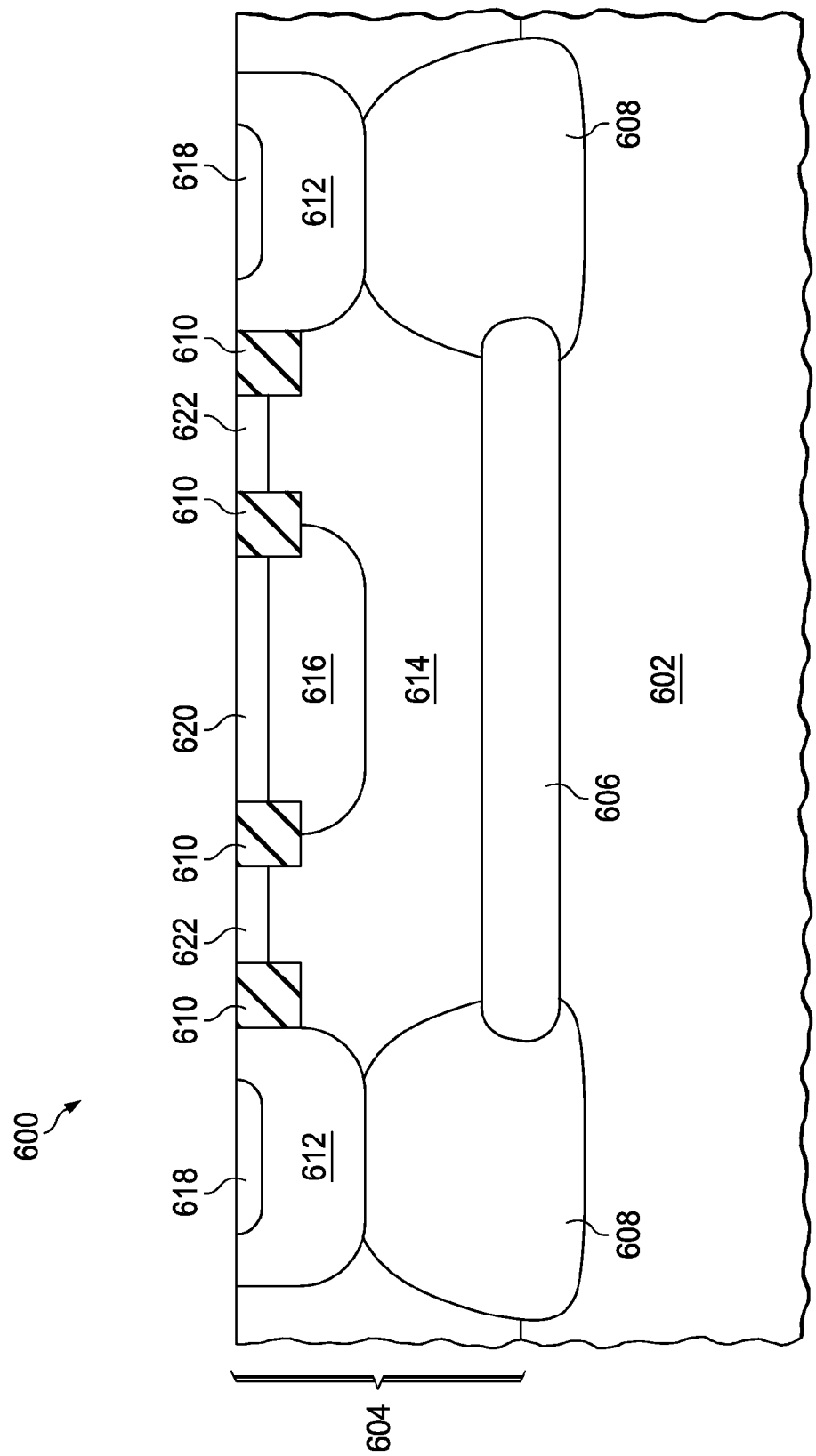
FIG. 6 is a cross-section of an IC containing the sixth embodiment of a combination of an n-type BISO layer and a shallow n-well.

FIG. 6 is a cross-section of an IC containing the sixth embodiment of a combination of an n-type BISO layer and a shallow n-well. The IC 600 is formed in a p-type substrate 602, typically single crystal silicon with an electrical resistivity between 0.001 and 10 ohm-cm. A p-type epitaxial layer 604, typically between 2 and 6 microns thick, is formed on a top surface of the substrate 602, as described in reference to FIG. 1A. An NBL region 606 is formed at the boundary between the p-type epitaxial layer 604 and the substrate 602, as described in reference to FIG. 1A through FIG. 1C, to provide a buried collector of an NPN bipolar transistor. An n-type BISO layer region 608 is formed as described in reference to FIG. 1A through FIG. 1C, so as to continuously overlap a lateral boundary of the NBL region 606. Elements of field oxide 610 are formed in the p-type epitaxial layer 604, by STI processes as described in reference to FIG. 1C, to provide lateral isolation of collector, base and emitter contact regions at a top surface of the p-type epitaxial layer 604. A collector contact shallow n-well 612 is formed in the p-type epitaxial layer 604, as described in reference to FIG. 1C, so as to continuously overlap the BISO layer region 608, forming a p-type isolated region 614 above the NBL region 606 to provide a base region of the NPN bipolar transistor. An emitter n-well 616 is formed in the p-type isolated region 614 to provide an emitter of the NPN bipolar transistor, possibly concurrently with the collector contact shallow n-well 612, such that the emitter n-well 616 is isolated from the collector contact shallow n-well 612 by field oxide elements 610. One or more n-type collector contact regions 618 are formed in the collector contact shallow n-well 612, preferably concurrently with n-type source and drain regions of NMOS transistors in the IC 600. One or more n-type emitter contact regions 620 are formed in the emitter n-well 616, preferably concurrently with the n-type collector contact regions 618. One or more p-type base contact regions 622 are formed in the p-type isolated region 614, isolated from the collector contact shallow n-well 612 and emitter n-well 616 by field oxide elements 610. The p-type base contact regions 622 are preferably formed concurrently with p-type source and drain regions of PMOS transistors in the IC 600.

Continuing to refer to FIG. 6, a bipolar transistor is provided by the emitter n-well 616 serving as the emitter, the p-type isolated region 614 serving as the base, and the NBL 606 serving as the buried collector. Contact is made to the collector through the n-type collector contact regions 618, collector contact shallow n-well 612 and BISO layer region 608. The bipolar transistor provided by the sixth embodiment is advantageous because less lateral area of the IC 600 is consumed by n-type regions to make contact to the buried collector than other contact configurations to buried collectors, for example n-sinkers.

Figure 7A:
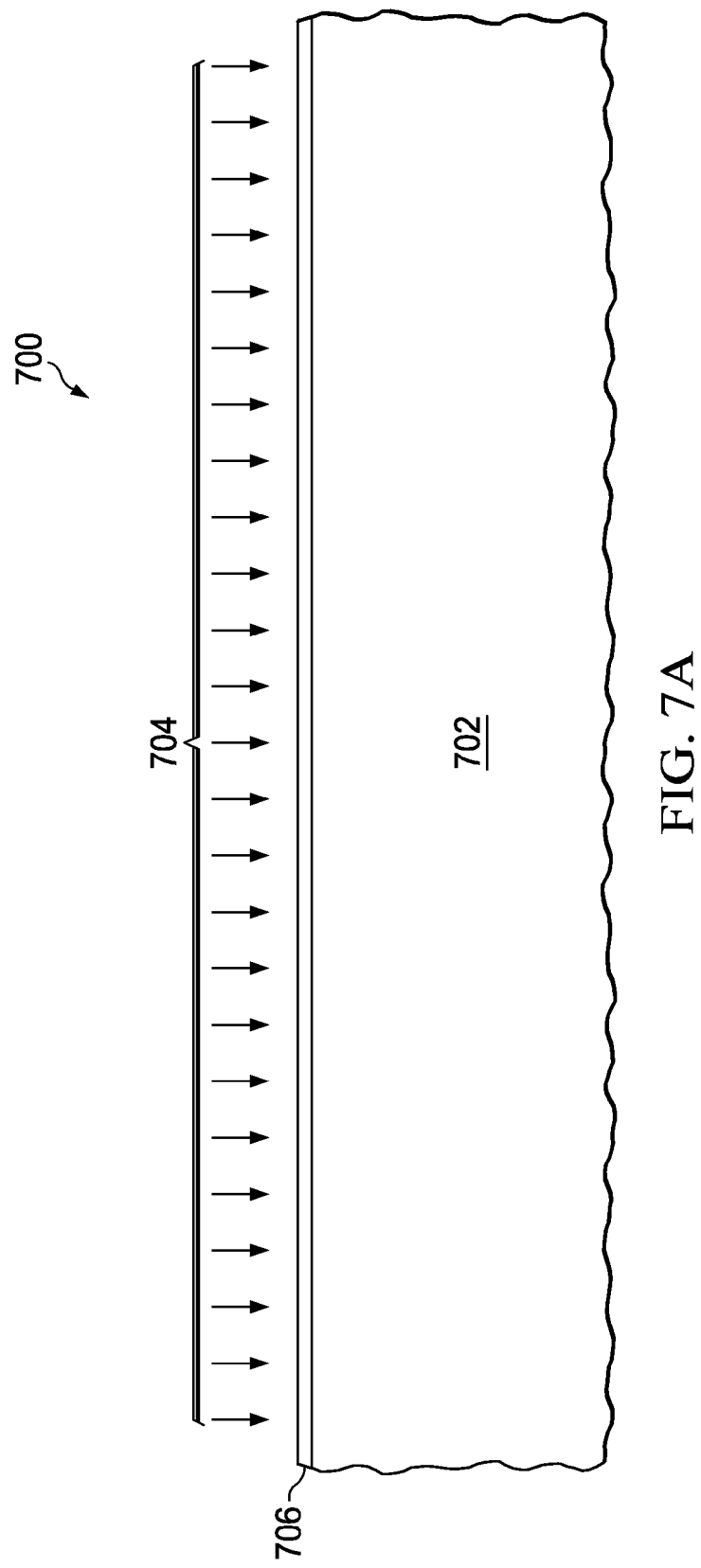
FIG. 7A through FIG. 7E are cross-sections of an IC containing a combination of an n-type BISO layer and a shallow n-well, with a p-type counter-doping layer, depicted in subsequent stages of fabrication.

FIG. 7A through FIG. 7E are cross-sections of an IC containing a combination of an n-type BISO layer and a shallow n-well, with a p-type counter-doping layer laterally adjacent to the n-type BISO layer to reduce lateral extents of the n-type BISO layer, thereby desirably reducing area consumed by the inventive combination of the n-type BISO layer and the shallow n-well, depicted in subsequent stages of fabrication. Referring to FIG. 7A, the IC 700 is formed in a p-type substrate 702, typically single crystal silicon with an electrical resistivity between 0.001 and 10 ohm-cm. A counter-doping set of p-type dopants 704 is ion implanted into a p-type counter-doping region 706 in a top region of the substrate 702. Optionally, the counter-doping region 706 may be defined by a counter-doping photoresist pattern, not shown in FIG. 7A for clarity.

Figure 7B:
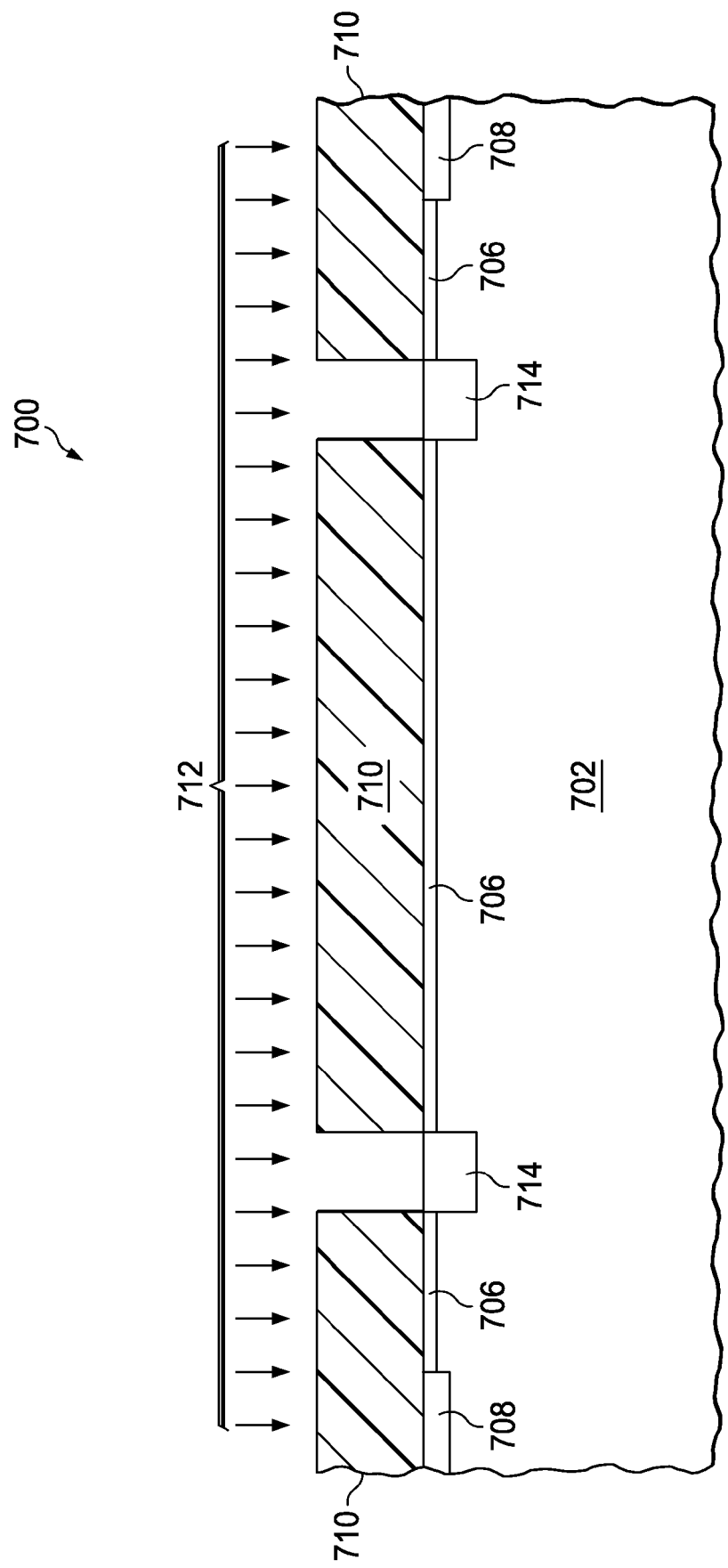

FIG. 7B depicts the IC 700 at a subsequent stage of fabrication. NBL implanted regions 708 are formed in the p-type substrate 702, by known NBL methods as described in reference to FIG. 1A. A BISO layer photoresist pattern 710 is formed on a top surface of the p-type substrate 702 which exposes an area for a BISO layer. The area defined for the BISO layer is continuous around a region to be isolated by a guard ring. A BISO layer set of n-type dopants 712, preferably phosphorus, and possibly including arsenic, is ion implanted, preferably at a dose between $1 \cdot 10^{13}$ and $1 \cdot 10^{15}$ atoms/cm$^2$, through the exposed area in the BISO layer photoresist pattern 710 to form a BISO layer implanted region 714 in a top region of the p-type substrate 702. The BISO layer implanted region 714 is continuous around the region to be isolated by a guard ring.

Figure 7C:
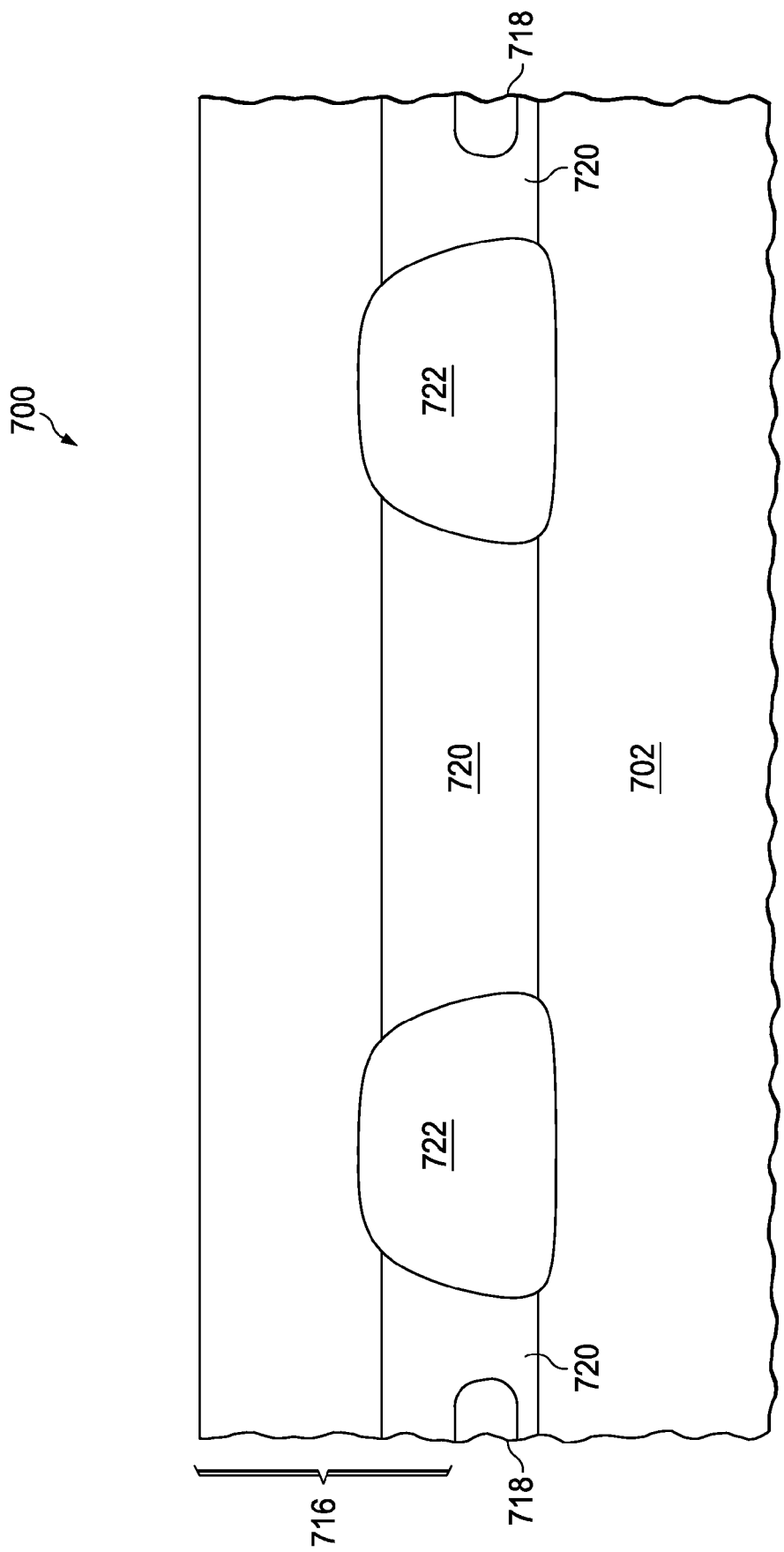

FIG. 7C depicts the IC 700 after a p-type epitaxial layer 716 is formed on the top surface of the p-type substrate 702 using known epitaxial growth methods. The p-type epitaxial layer 716 is typically 2 to 6 microns thick, but may be thicker if circuit operation at higher voltage is desired. During the epitaxial growth process, the NBL dopants diffuse upward into the p-type epitaxial layer 716, downward into the p-type substrate 702 and laterally to form NBL regions 718. Also during the epitaxial growth process, the p-type counter-doping dopants diffuse upward into the p-type epitaxial layer 716, downward into the p-type substrate 702 and laterally to form a p-type counter-doping region 720 above and below a boundary between the substrate 702 and the epitaxial layer 716. Furthermore, during the epitaxial growth process, the BISO layer dopants diffuse upward into the p-type epitaxial layer 716, downward into the p-type substrate 702 and laterally to form a BISO layer region 722 which surrounds the region to be isolated by a guard ring. Lateral extents of a p-n junction at a boundary of the BISO layer region 722 are reduced by the presence of the p-type counter-doping region 720, compared to a BISO layer region in an IC with no p-type counter-doping region. The BISO layer dopants diffuse upward a greater distance than the NBL dopants, due to a higher diffusivity of the BISO layer dopant species. A dose of the p-type counter-doping dopants may be adjusted to provide a desired width of the BISO layer region 722.

Figure 7D:
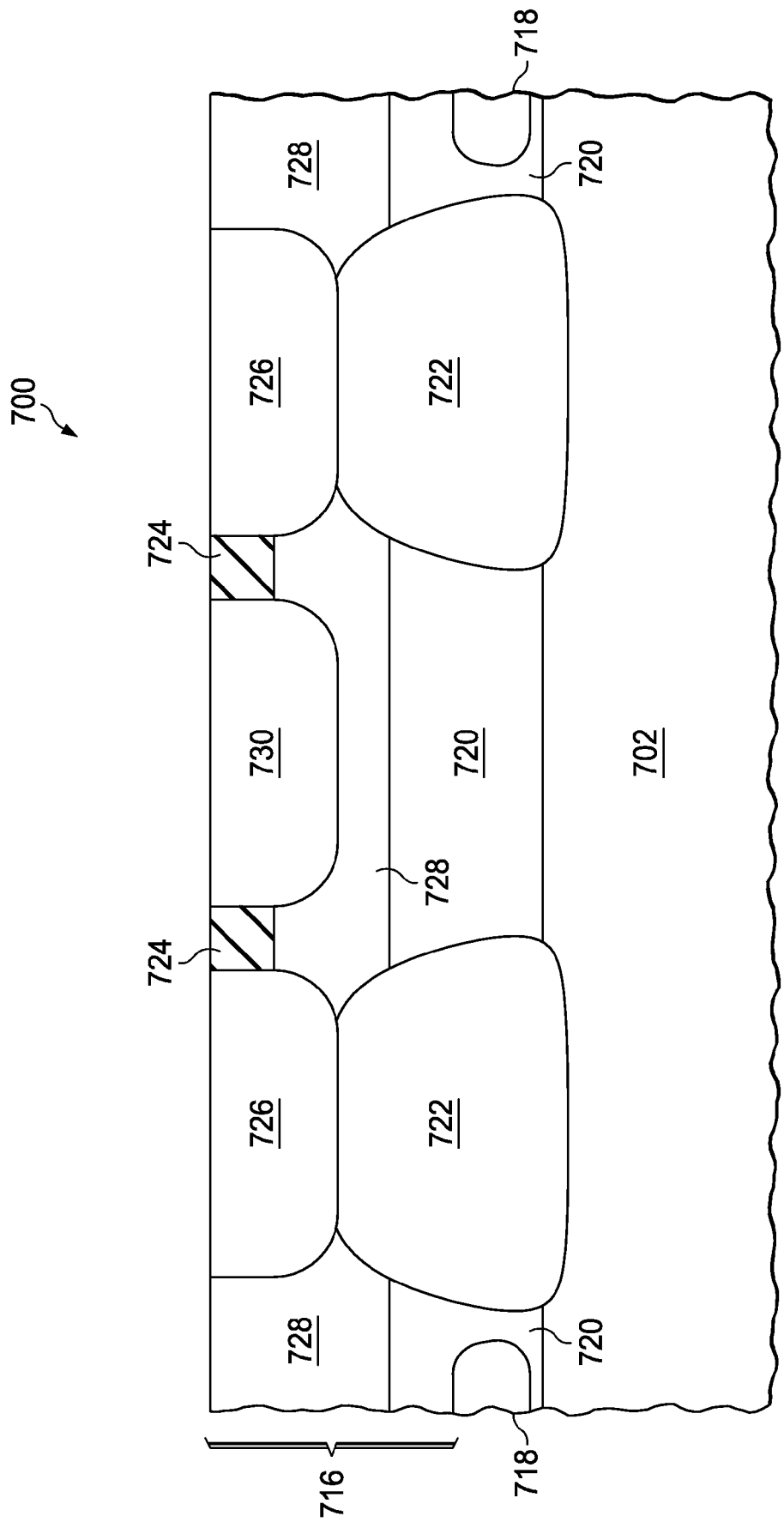

Referring to FIG. 7D, elements of field oxide 724 are formed by an STI process sequence, as described in reference to FIG. 1C. A shallow n-well 726 is preferably formed by known n-well methods, including ion implanting an n-well set of n-type dopants, preferably phosphorus, and possibly arsenic, preferably at a total dose between $1 \cdot 10^{13}$ and $3 \cdot 10^{14}$ atoms/cm$^2$, into an area of the p-type epitaxial layer 716 defined for the shallow n-well 726, followed by a rapid thermal anneal process to activate a portion of the n-well set of n-type dopants. During the STI process and the rapid thermal anneal process, the BISO layer dopants diffuse further upward into the p-type epitaxial layer 716, such that the BISO layer region 722 overlaps a bottom surface of the shallow n-well 726, surrounding a p-type isolated region 728 in the epitaxial layer 716. An optional shallow well 730 may be formed in the isolated region 728 to enhance performance of components subsequently formed in the isolated region 728. In a preferred embodiment, the BISO layer region 722 extends upward from the p-type substrate 702 between one-third and two-thirds of the thickness of the p-type epitaxial layer 716. In many instances, the p-type substrate 702 has a higher doping density than the p-type epitaxial layer 716, resulting is a downward extension of the BISO layer region 722 into the p-type substrate 702 that is less than the upward extension of the BISO layer region 722 into the p-type epitaxial layer 716. In other instances, the p-type substrate 702 has a lower doping density than the p-type epitaxial layer 716, resulting is a downward extension of the BISO layer region 722 into the p-type substrate 702 that is greater than the upward extension of the BISO layer region 722 into the p-type epitaxial layer 716.

Figure 7E:
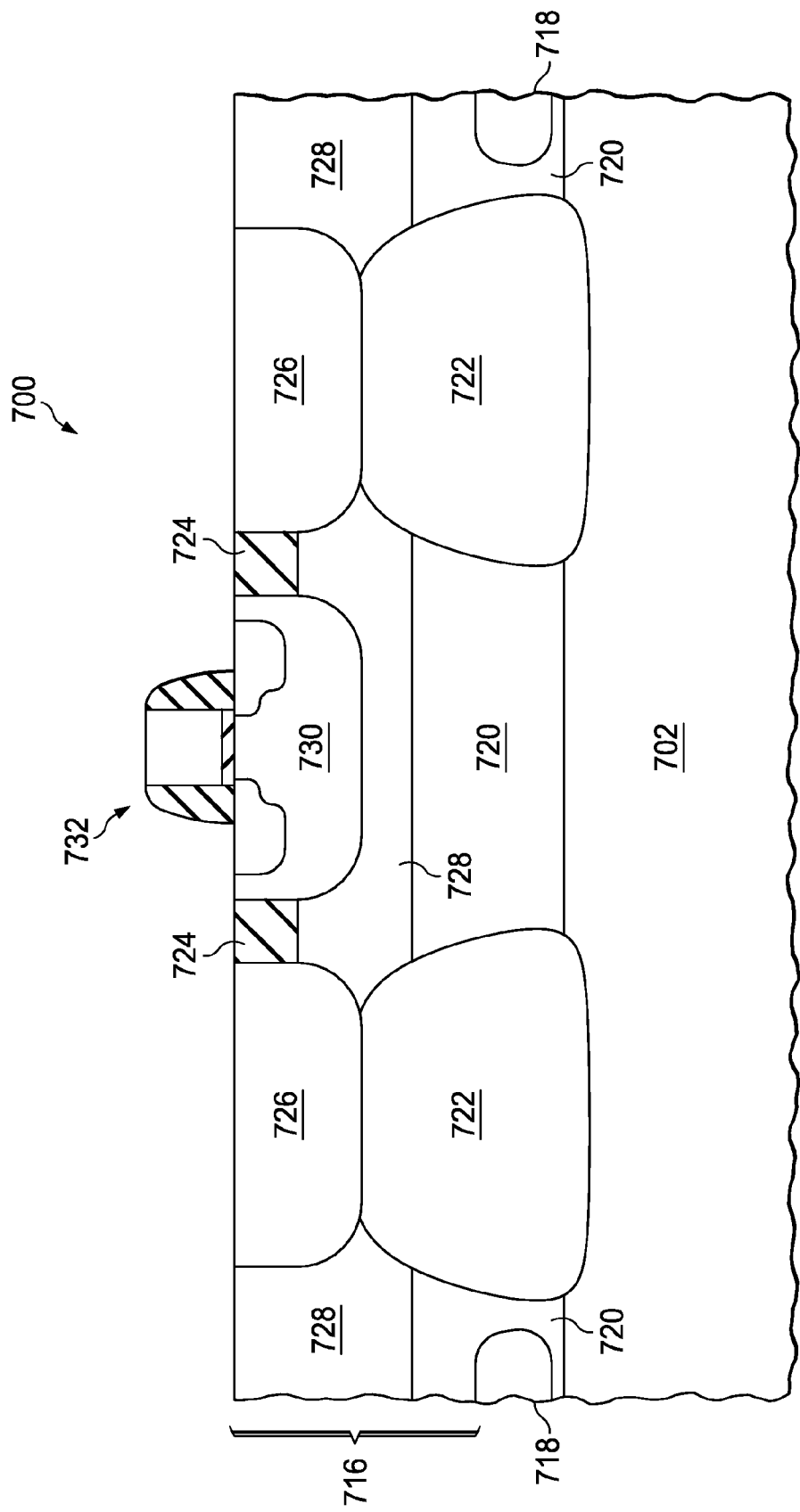

FIG. 7E depicts the IC 700 after formation of components of circuits in the IC 700 in the optional shallow well 730, exemplified by an MOS transistor 732. Components in the isolated region 728 are isolated by an n-type guard ring which includes the shallow n-well 726 and the BISO layer region 722.

The embodiment discussed in reference to FIG. 7A through FIG. 7E is advantageous because less lateral area in the IC 700 is consumed to provide a guard ring around the isolated region 728 than isolation configurations using BISO layers with no p-type counter-doping regions.

It will be recognized by those familiar with analog circuit fabrication that the advantage of using the p-type counter-doping region to reduce a lateral area of an isolation configuration including a BISO layer may be accrued in the first through fifth embodiments recited above.

What is claimed is:

1. An n-type isolation structure, comprising:
   an n-type buried isolation (BISO) layer overlapping a boundary between a p-type substrate and a p-type epitaxial layer, such that a top surface of said n-type BISO layer is lower than a top surface of said p-type epitaxial layer, and said n-type BISO layer is formed in a different area than an n-type buried layer (NBL); and
   a shallow n-well formed in said p-type epitaxial layer over said n-type BISO layer, extending from said top surface of said p-type epitaxial layer to, and overlapping a top surface of, said n-type BISO layer, wherein an average doping density in said shallow n-well is less than $10^{19}$ atoms/cm$^2$.

2. The n-type isolation structure of claim 1, in which:
   said n-type BISO layer overlaps a lateral boundary of said NBL in a continuous manner so as to surround a region of said p-type epitaxial layer above said NBL;
   said shallow n-well continuously overlaps a top surface of said n-type BISO layer so as to surround said region of said p-type epitaxial layer above said NBL; and
   said p-type region in said p-type epitaxial layer above said NBL is electrically isolated from said p-type substrate by said NBL, said n-type BISO layer and said shallow n-well.

3. The n-type isolation structure of claim 1, in which:
   said n-type BISO layer surrounds a region of said p-type epitaxial layer; and
   said shallow n-well continuously overlaps a top surface of said n-type BISO layer so as to surround said region of said p-type epitaxial layer.

4. The n-type isolation structure of claim 3, in which said BISO layer is continuous under said region of said p-type epitaxial layer, such that said region of said p-type epitaxial layer is electrically isolated from said p-type substrate by said n-type BISO layer and said shallow n-well.

5. The n-type isolation structure of claim 1, further comprising a p-type counter-doping layer laterally overlapping said n-type BISO layer.

6. An integrated circuit, comprising:
   an n-type isolation structure, further comprising:
      an n-type BISO layer overlapping a boundary between a p-type substrate and a p-type epitaxial layer, such that a top surface of said n-type BISO layer is lower than a top surface of said p-type epitaxial layer, and said n-type BISO layer is formed in a different area than an NBL; and
      a shallow n-well formed in said p-type epitaxial layer over said n-type BISO layer, extending from said top surface of said p-type epitaxial layer to, and overlapping a top surface of, said n-type BISO layer, wherein an average doping density in said shallow n-well is less than $10^{19}$ atoms/cm$^2$.

7. The integrated circuit of claim 6, further comprising a PMOS transistor formed in said shallow n-well.

8. The integrated circuit of claim 6, in which:
   said n-type BISO layer overlaps a lateral boundary of said NBL in a continuous manner so as to surround a region of said p-type epitaxial layer above said NBL;

said shallow n-well continuously overlaps a top surface of said n-type BISO layer so as to surround said region of said p-type epitaxial layer above said NBL; and said p-type region in said p-type epitaxial layer above said NBL is electrically isolated from said p-type substrate by said NBL, said n-type BISO layer and said shallow n-well;

and further comprising:
an NMOS transistor formed in said p-type region in said p-type epitaxial layer above said NBL; and
a PMOS transistor formed in said shallow n-well.

9. The integrated circuit of claim 6, in which:
said n-type BISO layer surrounds a region of said p-type epitaxial layer; and
said shallow n-well continuously overlaps a top surface of said n-type BISO layer so as to surround said region of said p-type epitaxial layer;
and further comprising an NMOS transistor formed in said region of said p-type epitaxial layer surrounded by said shallow n-well.

10. The integrated circuit of claim 9, in which said BISO layer is continuous under said region of said p-type epitaxial layer, such that said region of said p-type epitaxial layer is electrically isolated from said p-type substrate by said n-type BISO layer and said shallow n-well.

11. The integrated circuit of claim 6, further comprising:
an n-type buried collector region of an NPN bipolar transistor formed in said p-type epitaxial layer; and
an emitter well formed in said p-type epitaxial layer above said buried collector region;
and in which:
said n-type BISO layer overlaps a lateral boundary of said buried collector region in a continuous manner so as to surround a region of said p-type epitaxial layer above said buried collector region; and
said shallow n-well continuously overlaps a top surface of said n-type BISO layer so as to surround said region of said p-type epitaxial layer above said buried collector region.

12. The integrated circuit of claim 6, further comprising a p-type counter-doping layer laterally overlapping said n-type BISO layer.

13. The integrated circuit of claim 6, in which a lateral width of said n-type BISO layer is less than a vertical thickness of said p-type epitaxial layer.

14. A method of forming an integrated circuit, comprising the steps of:
providing a p-type substrate;
ion implanting an NBL set of n-type dopants into an area of said p-type substrate defined for said NBL;
ion implanting a BISO set of n-type dopants into an area of said p-type substrate defined for an n-type BISO layer which is different than said area defined for said NBL;
annealing said p-type substrate whereby said BISO set of n-type dopants diffuse outward into said p-type substrate;
forming a p-type epitaxial layer on a top surface of said p-type substrate such that said BISO set of n-type dopants diffuses upward into said p-type epitaxial layer between one-third and two-thirds of a vertical thickness of said p-type epitaxial layer; and
forming a shallow n-well in said p-type epitaxial layer over said n-type BISO layer, extending from a top surface of said p-type epitaxial layer to, and overlapping a top surface of, said n-type BISO layer, wherein an average doping density in said shallow n-well is less than $10^{19}$ atoms/cm$^2$.

15. The method of claim 14, further comprising the step of forming a PMOS transistor in said shallow n-well.

16. The method of claim 14, in which:
said n-type BISO layer overlaps a lateral boundary of said NBL in a continuous manner so as to surround a region of said p-type epitaxial layer above said NBL;
said shallow n-well continuously overlaps a top surface of said n-type BISO layer so as to surround said region of said p-type epitaxial layer above said NBL; and
said p-type region in said p-type epitaxial layer above said NBL is electrically isolated from said p-type substrate by said NBL, said n-type BISO layer and said shallow n-well;
and further comprising the steps of:
forming an NMOS transistor in said p-type region in said p-type epitaxial layer above said NBL; and
forming a PMOS transistor in said shallow n-well.

17. The method of claim 14, in which:
said n-type BISO layer surrounds a region of said p-type epitaxial layer; and
said shallow n-well continuously overlaps a top surface of said n-type BISO layer so as to surround said region of said p-type epitaxial layer;
and further comprising the step of forming an MOS transistor in said region of said p-type epitaxial layer surrounded by said shallow n-well.

18. The method of claim 17, in which said BISO layer is continuous under said region of said p-type epitaxial layer, such that said region of said p-type epitaxial layer is electrically isolated from said p-type substrate by said n-type BISO layer and said shallow n-well.

19. The method of claim 14, further comprising the steps of:
forming an n-type buried collector region of an NPN bipolar transistor in said p-type epitaxial layer; and
forming an emitter well in said p-type epitaxial layer above said buried collector region;
and in which:
said n-type BISO layer overlaps a lateral boundary of said buried collector region in a continuous manner so as to surround a region of said p-type epitaxial layer above said buried collector region; and
said shallow n-well continuously overlaps a top surface of said n-type BISO layer so as to surround said region of said p-type epitaxial layer above said buried collector region.

20. The method of claim 14, further comprising the step of ion implanting a p-type counter-doping set of p-type dopants into said area of said p-type substrate laterally overlapping said area defined for said n-type BISO layer.

* * * * *